(12) United States Patent
Yun et al.

(10) Patent No.: US 10,892,391 B2
(45) Date of Patent: Jan. 12, 2021

(54) LIGHT-EMITTING DEVICE PACKAGE INCLUDING A LEAD FRAME

(71) Applicant: SAMSUNG ELECTRONICS CO., LTD., Suwon-si (KR)

(72) Inventors: Ji-hoon Yun, Suwon-si (KR); Jong-sup Song, Hwaseong-si (KR); Seol-young Choi, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/550,816

(22) Filed: Aug. 26, 2019

(65) Prior Publication Data

US 2020/0058839 A1 Feb. 20, 2020

Related U.S. Application Data

(63) Continuation of application No. 15/796,190, filed on Oct. 27, 2017, now Pat. No. 10,510,936.

(30) Foreign Application Priority Data

Apr. 26, 2017 (KR) .................. 10-2017-0053563

(51) Int. Cl.
*H01L 33/62* (2010.01)
*H01L 33/48* (2010.01)
(Continued)

(52) U.S. Cl.
CPC .............. *H01L 33/62* (2013.01); *H01L 24/16* (2013.01); *H01L 24/17* (2013.01); *H01L 33/486* (2013.01);
(Continued)

(58) Field of Classification Search
CPC ....... H01L 33/62; H01L 24/17; H01L 33/486; H01L 33/502; H01L 33/60; H01L 24/16;
(Continued)

(56) References Cited

U.S. PATENT DOCUMENTS 6,372,608 B1 4/2002 Shimoda et al.
6,645,830 B2 11/2003 Shimoda et al.
(Continued)

FOREIGN PATENT DOCUMENTS

JP 4403199 1/2010
KR 10-1141492 5/2012
(Continued)

OTHER PUBLICATIONS

Office Action dated Aug. 31, 2020 for U.S. Appl. No. 16/853,991.

*Primary Examiner* — Mohammad M Hoque
(74) *Attorney, Agent, or Firm* — F. Chau & Associates, LLC

(57) ABSTRACT

A light-emitting device package includes a lead frame, a light-emitting device chip, a molding structure, and a plurality of slots. The lead frame includes a first lead and a second lead including metal and spaced apart from each other. The light-emitting device chip is mounted on a first area of the lead frame, which includes a part of the first lead and a part of the second lead. The molding structure includes an outer barrier surrounding an outside of the lead frame and an inner barrier. The plurality of slots are formed in each of the first lead and the second lead. The inner barrier divides the lead from into the first area and a second area. The inner barrier fills between the first lead in the second lead. The second area is located outside of the first area. The plurality of slots are filled by the molding structure.

20 Claims, 21 Drawing Sheets

(51) Int. Cl.
*H01L 33/50* (2010.01)
*H01L 33/60* (2010.01)
*H01L 23/00* (2006.01)
*H01L 27/02* (2006.01)
*H01L 29/866* (2006.01)

(52) U.S. Cl.
CPC ............ *H01L 33/502* (2013.01); *H01L 33/60* (2013.01); *H01L 24/13* (2013.01); *H01L 27/0248* (2013.01); *H01L 27/0255* (2013.01); *H01L 29/866* (2013.01); *H01L 2224/13101* (2013.01); *H01L 2224/16245* (2013.01); *H01L 2224/16257* (2013.01); *H01L 2224/17106* (2013.01); *H01L 2224/81011* (2013.01); *H01L 2224/81385* (2013.01); *H01L 2224/81815* (2013.01); *H01L 2924/12041* (2013.01); *H01L 2924/3512* (2013.01); *H01L 2933/0033* (2013.01)

(58) Field of Classification Search
CPC ......... H01L 27/0255; H01L 2933/0033; H01L 2224/81011; H01L 2924/12041; H01L 2224/81385; H01L 2224/17106; H01L 2224/16245; H01L 2224/13101; H01L 2224/81815; H01L 24/13; H01L 2924/3512; H01L 27/0248; H01L 29/866; H01L 2224/16257; H01L 33/483
USPC .......................................................... 257/98
See application file for complete search history.

(56) References Cited

U.S. PATENT DOCUMENTS

| | | | |
|---|---|---|---|
| RE38,466 E | 3/2004 | Inoue et al. | |
| 6,747,293 B2 | 6/2004 | Nitta et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,242,032 B2 | 7/2007 | Oshio | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,692,206 B2 | 4/2010 | Loh | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 9,172,013 B2 | 10/2015 | Mo et al. | |
| 9,368,704 B2 | 6/2016 | Nakabayashi et al. | |
| 9,947,636 B2* | 4/2018 | Talledo | H01L 23/3107 |
| 10,756,245 B2 | 8/2020 | Wittmann et al. | |
| 2002/0020907 A1 | 2/2002 | Seo et al. | |
| 2002/0190262 A1 | 12/2002 | Nitta et al. | |
| 2005/0161771 A1* | 7/2005 | Suehiro | H01L 33/56 257/612 |
| 2006/0043401 A1* | 3/2006 | Lee | H01L 24/97 257/99 |
| 2012/0074451 A1* | 3/2012 | Lin | H01L 33/62 257/99 |
| 2012/0138989 A1* | 6/2012 | Yoo | H01L 33/62 257/98 |
| 2012/0205696 A1* | 8/2012 | Yoo | H01L 33/642 257/98 |
| 2013/0037837 A1* | 2/2013 | Kang | H01L 24/97 257/98 |
| 2013/0062632 A1* | 3/2013 | Lee | H01L 33/486 257/88 |
| 2013/0181236 A1 | 7/2013 | Tamaki et al. | |
| 2013/0234181 A1* | 9/2013 | Watari | H01L 33/505 257/98 |
| 2014/0159076 A1* | 6/2014 | Sota | H01L 24/85 257/88 |
| 2014/0252574 A1 | 9/2014 | Nakabayashi et al. | |
| 2014/0252582 A1 | 9/2014 | Nakabayashi et al. | |
| 2015/0349225 A1* | 12/2015 | Oh | H01L 33/62 257/99 |
| 2016/0013378 A1 | 1/2016 | Sakamoto et al. | |
| 2016/0013382 A1 | 1/2016 | Ozeki et al. | |
| 2016/0027968 A1* | 1/2016 | Yoshimizu | H01L 33/486 257/98 |
| 2016/0043291 A1* | 2/2016 | Gebuhr | H01L 25/50 257/88 |
| 2016/0046198 A1 | 2/2016 | Krammer | |
| 2016/0056143 A1* | 2/2016 | Park | H01L 25/167 257/91 |
| 2016/0056356 A1 | 2/2016 | Oh et al. | |
| 2016/0079217 A1 | 3/2016 | Egoshi et al. | |
| 2016/0093785 A1* | 3/2016 | Fukuda | H01L 33/486 257/99 |
| 2016/0190413 A1 | 6/2016 | Abe et al. | |
| 2016/0254214 A1* | 9/2016 | Makino | H01L 23/49582 257/676 |
| 2017/0155021 A1 | 6/2017 | Fukuda | |
| 2017/0288103 A1* | 10/2017 | Fukuda | H01L 33/60 |
| 2017/0317252 A1* | 11/2017 | Bak | H01L 33/62 |
| 2017/0324012 A1 | 11/2017 | Wittmann et al. | |
| 2018/0315912 A1 | 11/2018 | Yun et al. | |
| 2019/0086039 A1* | 3/2019 | Lee | H01L 33/52 |

FOREIGN PATENT DOCUMENTS

| | | |
|---|---|---|
| KR | 10-2013-0096095 | 8/2013 |
| KR | 10-2014-0004351 | 1/2014 |
| KR | 10-1367381 | 2/2014 |
| KR | 10-1476423 | 12/2014 |
| KR | 10-1503497 | 3/2015 |
| KR | 10-2016-0046198 | 4/2016 |

* cited by examiner

LIGHT-EMITTING DEVICE PACKAGE INCLUDING A LEAD FRAME

CROSS-REFERENCE TO RELATED APPLICATION

This application is a Continuation of co-pending U.S. patent application Ser. No. 151796190, filed on Oct. 27, 2017, which claims the benefit of Korean Patent Application No. 10-2017-0053563, filed on Apr. 26, 2017 in the Korean. Intellectual Property Office, the disclosures of which are incorporated by reference herein in their entirety.

BACKGROUND

The inventive concept relates to a light-emitting device package, and more particularly, to a light-emitting device package including a metallic lead frame and a plastic molding material.

A semiconductor light-emitting device such as a light-emitting diode (LED) or a laser diode (LD) uses an electroluminescence phenomenon, i.e., a phenomenon in which light may be emitted from a material (e.g., a semiconductor material) by applying a current or voltage, and may be formed based on a compound semiconductor. For example, a gallium nitride-based light-emitting device may be widely used as a device with high efficiency and high brightness. A light-emitting device such as an LED has advantages, such as a long lifetime, low power consumption, fast response speed, environmental friendliness, etc., and may be used as a light source in various products such as a backlight of a lighting device and a display device.

SUMMARY

The inventive concept provides a light-emitting device package with enhanced light extraction efficiency. The light-emitting device package may improve a property difference between a lead frame and a molding material.

According to an aspect of the inventive concept, there may be provided a light-emitting device package including a lead frame including a first lead and a second lead including metal and spaced apart from each other; a light-emitting device chip mounted on a first area of the lead frame, the first area of the lead frame including a part of the first lead and a part of the second lead; a molding structure including an outer barrier surrounding an outside of the lead frame and an inner barrier; and a plurality of slots formed in each of the first lead and the second lead. The inner barrier divides the lead frame into the first area and a second area. The inner barrier fills between the first lead and the second lead. The second area is located outside of the first area. The plurality of slots are titled by the molding structure.

According to another aspect of the inventive concept, there may be provided a light-emitting device package including a lead frame including a first lead and a second lead electrically separated from each other and including metal; a molding structure; a light-emitting device chip mounted on a first area of the lead frame in a flip-chip structure; and a plurality of slots formed in each of the first lead and the second lead, and tilled by the molding structure. The molding structure includes an outer barrier surrounding an outside of the lead frame, an inner barrier, and an electrode separator electrically separating the first lead and the second lead by filling between the first lead and the second lead. The inner barrier divides the lead frame into the first area and a second area. The second area is disposed outside the first area.

According to another aspect of the inventive concept, there may be provided a light-emitting device package including a first lead; a second lead spaced apart from the first lead; a light emitting device chip mounted on a first area that includes a portion of the first lead and a portion of the second lead; a molding structure including an outer barrier, an inner barrier and an electrode separator; and a plurality of slots formed in the first lead and the second lead, and filled by the molding structure. The inner barrier divides the first lead into a first portion and a second portion. The second portion is located outside of the first portion. The inner barrier divides the second lead into a third portion and a fourth portion. The fourth portion is located outside of the third portion. The first, portion of the first lead is included in the first area. The third portion of the second lead is included in the first area. The first lead and the second lead are surrounded by the outer barrier. The electrode separator is disposed between the first lead and the second lead, and electrically separates the first lead and the second lead. The first groove is disposed in the first portion of the first lead. The second groove is disposed in the third portion of the second lead.

BRIEF DESCRIPTION OF THE DRAWINGS

Embodiments of the inventive concept be more clearly understood from the following detailed description taken in conjunction with the accompanying drawings, in which.

DETAILED DESCRIPTION OF THE EMBODIMENTS

Figure 1:
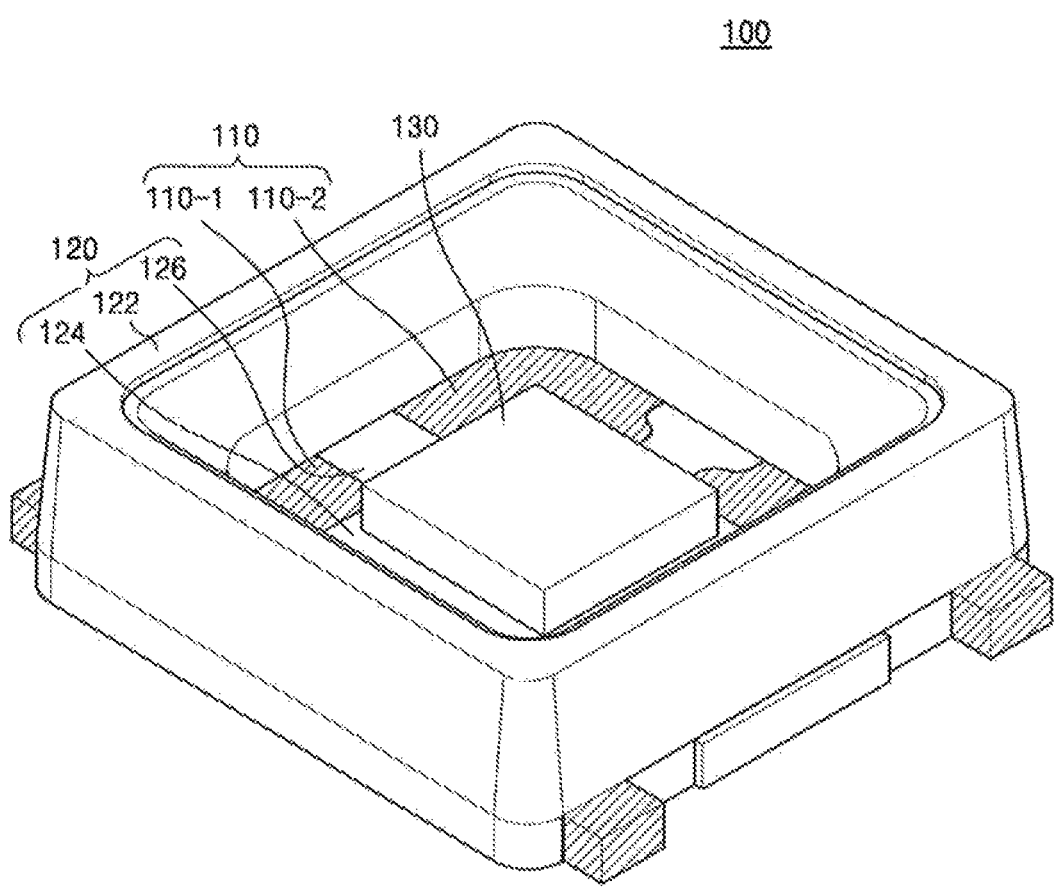
FIG. 1 is a perspective view of a light-emitting device package according to an embodiment.
Figure 2:
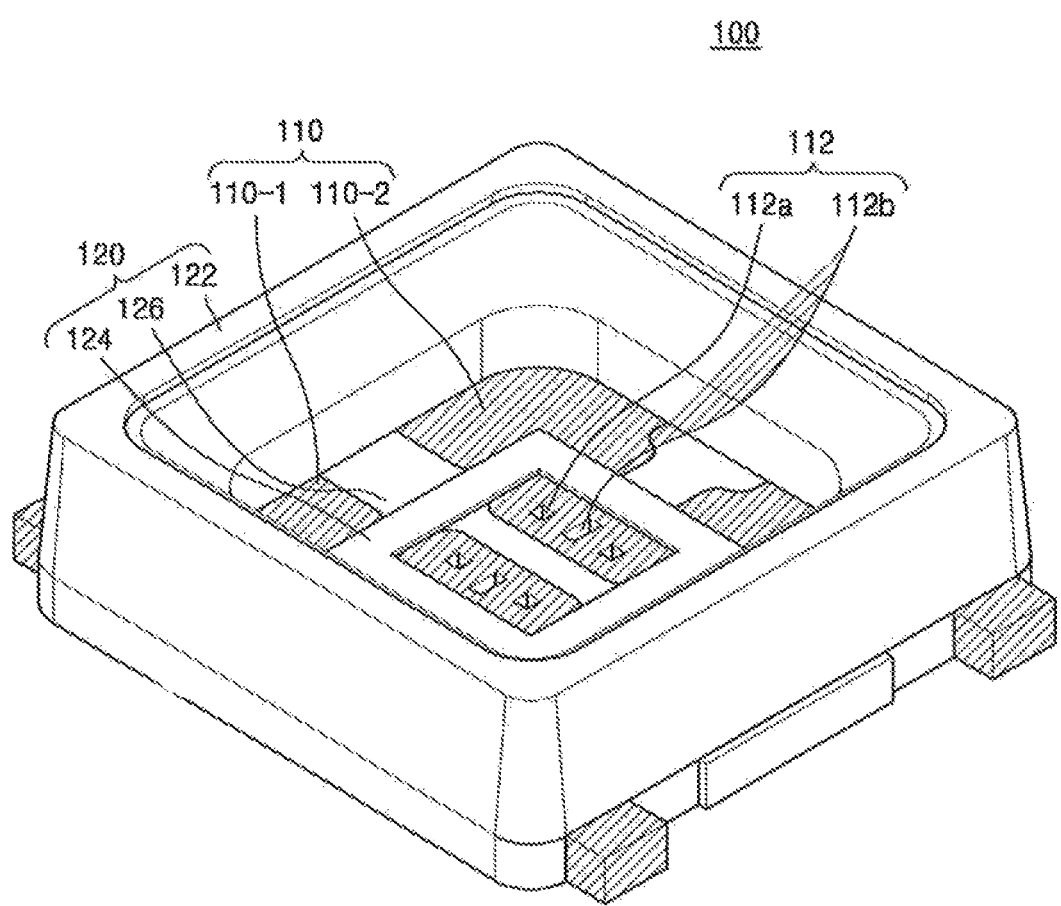
FIG. 2 is a perspective view illustrating only a lead frame and a molding structure of the light-emitting device package of FIG. 1 and excluding a light-emitting chip.
Figure 3A:
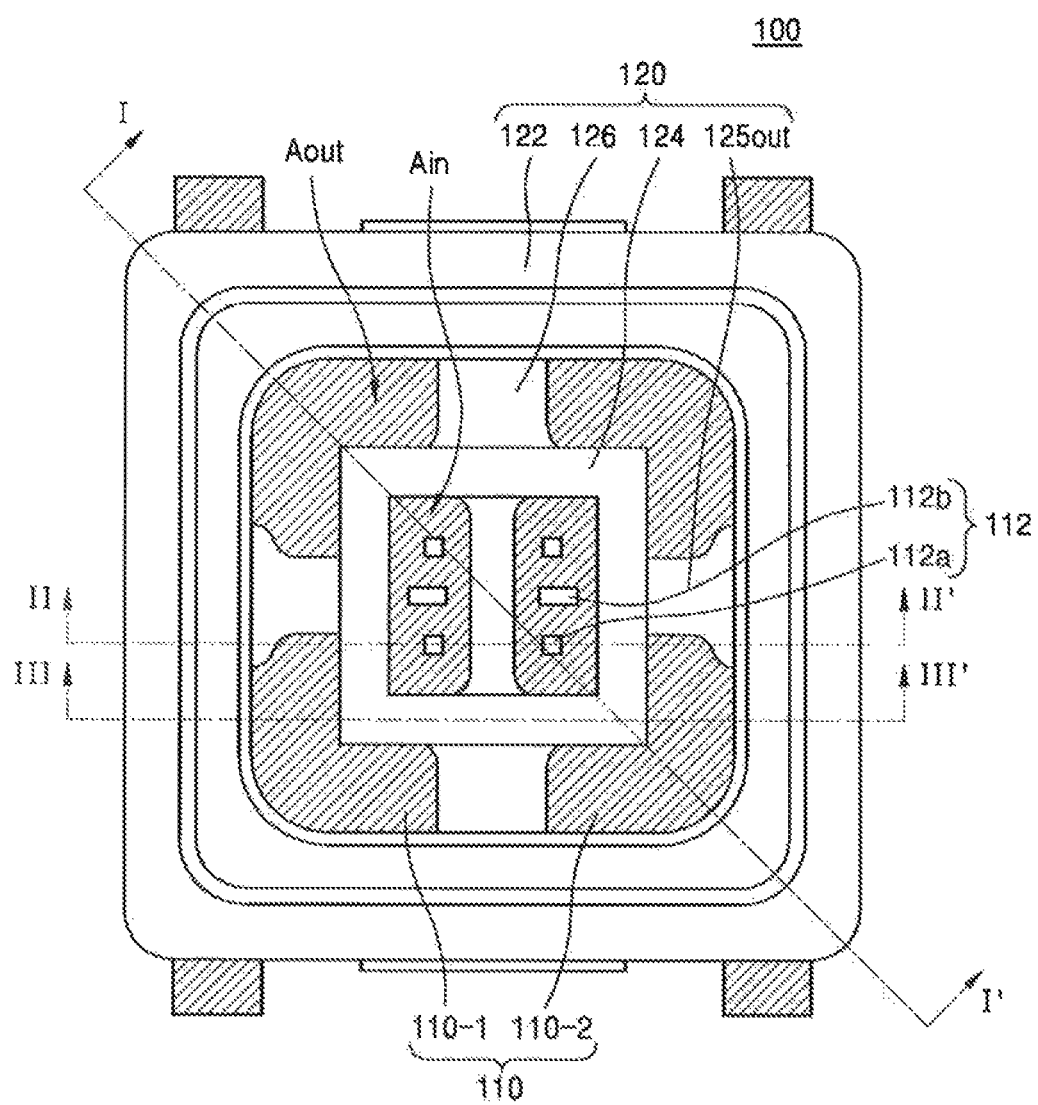
FIG. 3A is a plan view of the light-emitting device package of FIG. 2.
Figure 3B:
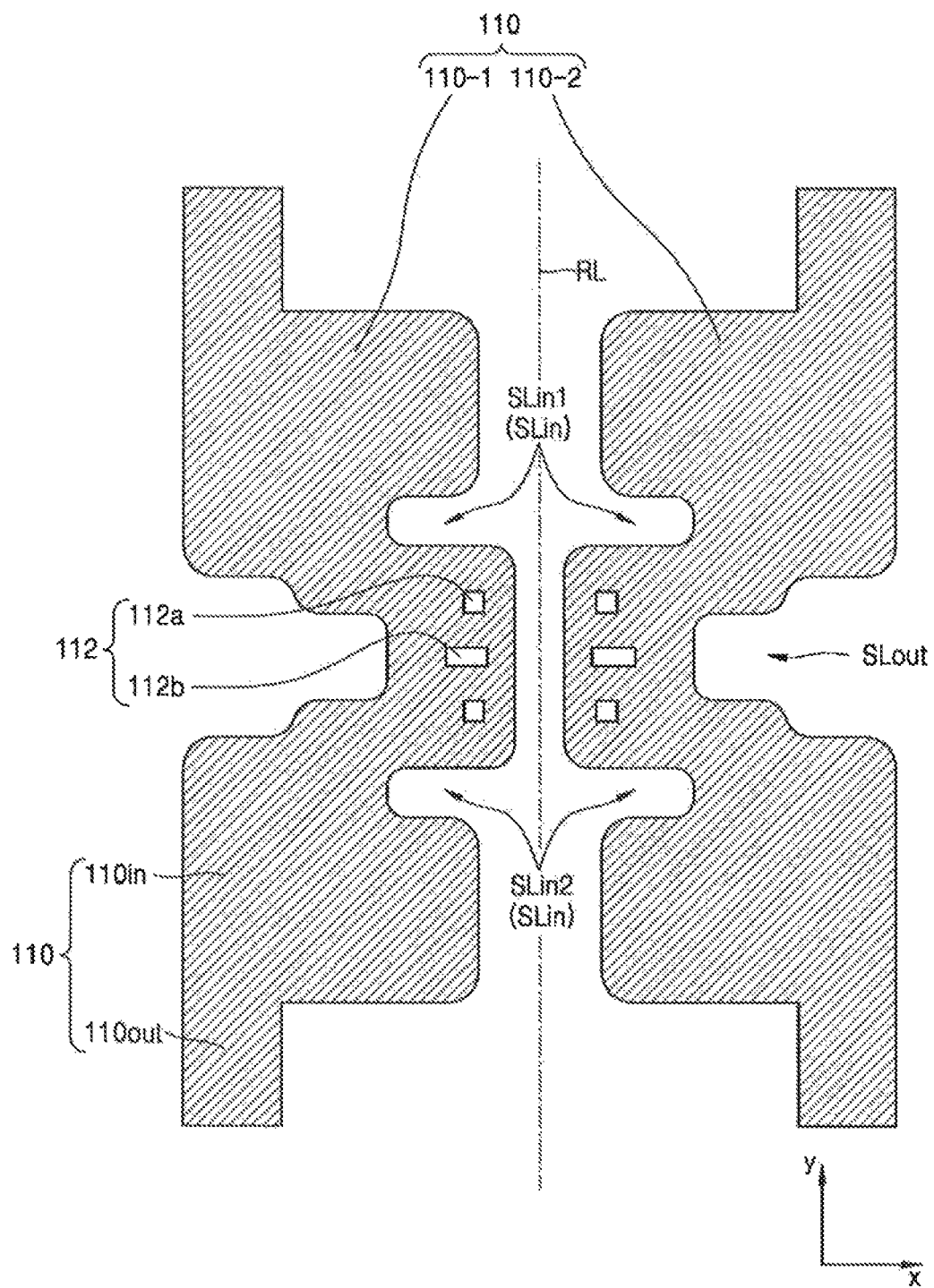
FIG. 3B is a plan view showing only the lead frame of the light-emitting device package of FIG. 2.
Figure 3C:
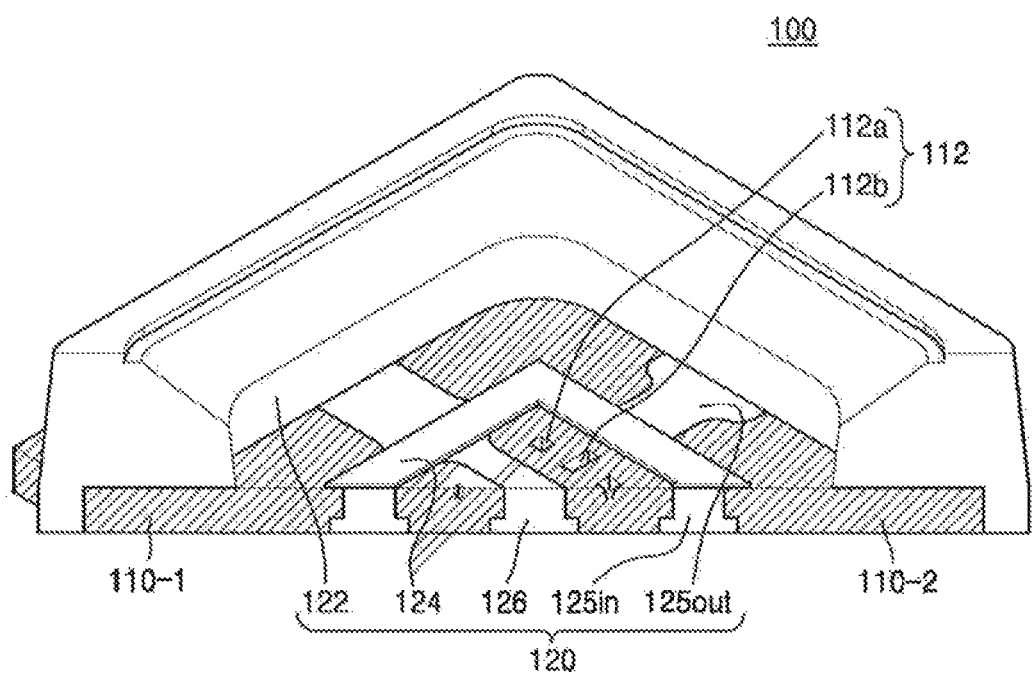
FIG. 3C is a cross-sectional view taken along a line I-I' of the light-emitting device package of FIG. 2.

FIG. 1 is a perspective view of a light-emitting device package 100 according to an embodiment. FIG. 2 is a perspective view illustrating, only a lead frame 110 and a molding structure 120 of the light-emitting device package 100 of FIG. 1 excluding a light-emitting chip 130. FIG. 3A is a plan view of the light-emitting device package 100 of FIG. 2. FIG. 3B is a plan view showing only the lead frame 110 of the light-emitting device package 100 of FIG. 2. FIG. 3C is a cross-sectional view taken along a line I-I' of the light-emitting device package 100 of FIG. 2. For reference, a fluorescent layer may be omitted in the light-emitting device package 100 of FIGS. 1 to 3C.

Referring to FIGS. 1 to 3C, the light-emitting device package 100 of the present embodiment may include the lead frame 110, the molding structure 120, and the light-emitting device chip 130.

The lead frame 110 may be formed in a metal plate shape as shown in FIG. 3B and may include a first lead 110-1 and a second lead 110-2. For example, the lead frame 110 may be formed of a metal such as a nickel-iron alloy, copper, a copper alloy, or the like. On an upper surface of the lead frame 110, plating of a highly reflective material such as silver (Ag) may be performed. A plating layer of the highly reflective material on the upper surface of the lead frame 110 may reflect light generated from the light-emitting device chip 130 to increase light extraction efficiency and brightness. The plating layer of the highly reflective material may be formed on an entire upper surface of the lead frame 110 or only an a part of the upper surface of the lead frame 110 in terms of a structural aspect of the light-emitting device package 100.

The first lead 110-1 and the second lead 110-2 may be spaced apart from each other in the light-emitting device package 100 and may have a symmetrical structure with respect to a reference line RL at a center. Therefore, for convenience of explanation, only the first lead 110-1 will be described below.

The first lead 110-1 may include an inner lead 110in surrounded by the molding structure 120 and an outer lead 110out protruding from the molding structure 120. The first lead 110-1 may be formed with an inner slot SLin which may be recessed inward from an inner side adjacent to the reference line RL and an outer slot SLout which may be recessed inward from an outer side. When the reference line RL extends in a second direction (e.g., a Y-axis direction), the inner slot SLin and the outer slot SLout extend in a first direction (e.g., an X-axis direction) perpendicular to the second direction (e.g., the Y-axis direction).

The inner slots SLin ma be formed at both ends of a first area Ain in the second direction (e.g., the Y-axis direction) where the light-emitting device chip 130 is mounted. The first area Ain will be described in more detail in a description of the molding structure 120. Two inner slots SLin may be formed in each of the first lead 110-1 and the second lead 110-2. Two inner slots SLin symmetrical with respect to the reference line RL may be formed m one pair. For example, the inner slots SLin of the first lead 110-1 and the second lead 110-2 on an upper portion of the first area Ain in the second direction (e.g., the Y-axis direction) may constitute a first inner slot pair SLin1, and the inner slots SLin of the first and second leads 110-1 and 110-2 on a lower portion of the first area Ain in the second direction (e.g., the Y-axis direction) may constitute a second inner slot pair SLin2.

The outer slot SLout may be formed at both ends of the first area Ain in the first direction (e.g., the X-axis direction). The outer slot SLout may be formed in each of the first lead 110-1 and the second lead 110-2 so that two outer slots SLout symmetrical with respect to the reference line RL may constitute one pair. As shown in FIG. 3B, the outer slot SLout may have a broad width on an entrance side and a narrow width on an inner side, but the outer slot SLout is not limited thereto. The outer slot SLout may have a structure in which the widths of the entrance side and the inner side are substantially the same.

The inner slot SLin and the outer slot SLout may be filled with the molding structure 120 in a state of the light-emitting device package 100, as shown in FIGS. 3A and 3C. As described above, the slots SLin and SLout may be formed in the first lead 110-1 and the second lead 110-2 of the lead frame 110, respectively. Portions of the slots SLin and SLout may be filled by the molding structure 120, and thus coupling between the lead frame 110 and the molding structure 120 may become strong, thereby improving reliability of the light-emitting device package 100. For example, in a conventional light-emitting device package, a stress may be generated due to a difference in physical properties between a lead frame made of a metal and a molding structure made of a plastic material. As a result, unstable coupling such as widening between the lead frame and the molding structure or bending of the led frame may occur, which causes the reliability of the light-emitting device package to deteriorate. However, since the slots SLin and SLout are formed in the lead frame 110 in the light-emitting device package 100 of the inventive concept, the stress due to the difference in physical properties between the lead frame 110 and the molding structure 120 may be alleviated, and thus the coupling between the frame 110 and the molding structure 120 may be made firm. Therefore, the reliability of the light-emitting device package 100 may be improved.

The slots SLin and SLout of the lead frame 110 may function to expand a passage through which molding materials in a fluid state flow in a molding process for forming the molding structure 120, and thus an injection property of the molding process may be improved. The injection property of the molding process will be described in more detail in a description of an inner barrier 124 of the molding structure 120.

A dimple or a groove 112 may be formed in the first area Ain of the first lead 110-1. The groove 112 may include a first groove 112a and a second groove 112b. When the light-emitting device chip 130 is mounted in the first area Ain of the lead frame 110 in a flip-chip structure through the solder ball 135 in FIG. 4, the first groove 112a may be formed in a portion in which the solder hall 135 is positioned. Accordingly, the number of the first grooves 112a may be equal to the number of the solder balls 135. The first groove 112a will be described in more detail in a description of FIG. 4.

The second groove 112b may be a groove for separating the solder balls 135 from each other. For example, the second grooves 112b may accommodate a part of the solder ball 135 that may flow in a fluid state, such as a fluxing process to the solder ball 135, or a reflow process, thereby functioning to prevent the solder ball 135 from adhering to the adjacent solder ball 135. In some embodiments, the second groove 112b may be omitted.

The molding structure 120 may be formed of a white molding material having excellent light reflectance. The molding structure 120 may be formed of a black or other colored molding material as well as the white molding material, depending on a structure and a function. For example, when the molding structure 120 does not perform a high reflection function, the molding structure 120 may be formed of the black or other colored molding material independent of a reflective property. The molding structure 120 may be formed through a molding process using a mold, for example, an injection molding process.

The molding structure 120 may include a molding resin and a highly reflective powder dispersed in the molding resin. For example, the molding resin may be formed of an epoxy resin, a silicone resin, a polyester resin, or the like having a high reflectance. The highly reflective powder may include, for example, metal powder having high reflectivity, for example, metal powder such as Al or Ag. The metal powder may be appropriately contained in a range in which the molding structure 120 is maintained as an insulator. Also, the highly reflective powder may include ceramic powder having high reflectivity, for example, ceramic powder such as $TiO_2$, $Al_2O_3$, $Nb_2O_5$, or $ZnO$. The highly reflective powder may reflect the light generated from the light-emitting device chip 130, thereby minimizing loss of light generated from a side surface of the light-emitting device chip 130 and enhancing the light extraction efficiency.

The molding structure 120 may include an outer barrier 122, the inner barrier 124, and an electrode separator 126.

The outer barrier 122 may have a rectangular ring structure and surround an outer portion of the lead frame 110. In addition, a portion extending from the outer barrier 122 may cover an outer side surface of the lead frame 110. The outer barrier 122 may have a predetermined height from an upper surface of the lead frame 110. The height of the external partition 122, which is the outer barrier 122, may be determined by taking into consideration a thickness of the light-emitting device chip 130, a thickness of a fluorescent layer 140 of FIG. 4, the light extraction efficiency, and the like as a whole.

The outer barrier 122 may have an inner surface structure that may maximize extraction efficiency of light emitted from the light-emitting device chip 130. For example, as shown in FIGS. 1 to 3C, the inner surface of the outer barrier 122 may be formed in a structure having two step inclined surfaces. Each angle of the two step inclined surfaces ma be formed so as to maximize extraction efficiency of light. Of course, the inner surface of the outer partition wall 122, which is the outer barrier 122, may be formed in a structure having one inclined surface instead of the two step inclined surfaces, or in a structure having three or more step inclined surfaces.

In the light-emitting device package 100 of the present embodiment, the outer barrier 122 has a rectangular ring structure, but the outer barrier 122 is not limited to the rectangular ring structure. For example, in the light-emitting device package 100 of the present embodiment, the outer barrier 122 may have a variety of structures such as a circular ring, an elliptical ring, and a polygonal ring other than a rectangle ring.

The inner barrier 124 may divide an area of the upper surface of the lead frame 110 that is located inside the outer barrier 122 into the first area Ain and the second. area Aout. In this regard, the first area Ain may be located at a central portion of the lead frame 110 as an area where the light-emitting device chip 130 is mounted. The second area Aout may surround the first area Ain and may be located at an outer portion of the lead frame 110. A Zener diode or the like may be arranged in the second area Aout. The Zener diode is a diode having a characteristic of being electrically conducted in a reverse direction when a voltage equal to or higher than a Zener voltage is applied in the reverse direction. The Zener diode may be connected in parallel to the light-emitting device chip 130 When an overvoltage occurs, a current flows through the Zener diode, thereby protecting the light-emitting device chip 130 from the overvoltage.

The inner barrier 124 may have a rectangular ring shape as shown in FIG. 3A and the like. A shape of the inner partition wall 124 which is the inner barrier, is not limited to the rectangular ring shape. For example, the inner barrier 124 may be formed in various shapes based on a shape of the light-emitting device chip 130, a shape of the first area Ain, a flip-chip bonding structure of the light-emitting device chip 130, or light extraction efficiency, etc. Further, the inner barrier 124 may be formed as a closed ring structure as shown in FIG. 3A. However, the inner barrier 124 is not limited to the closed ring structure but may be formed with an open ring structure. The closed ring structure of the inner barrier 124 will be described in more detail in a description of FIG. 12.

The inner barrier 124 may be formed to have a very thin thickness from the upper surface of the lead frame 110. For example, the internal barrier 124 may be formed to have a thickness that allows the molding process to proceed smoothly while physically separating the first area Ain and the second area Ain.

Figure 4:
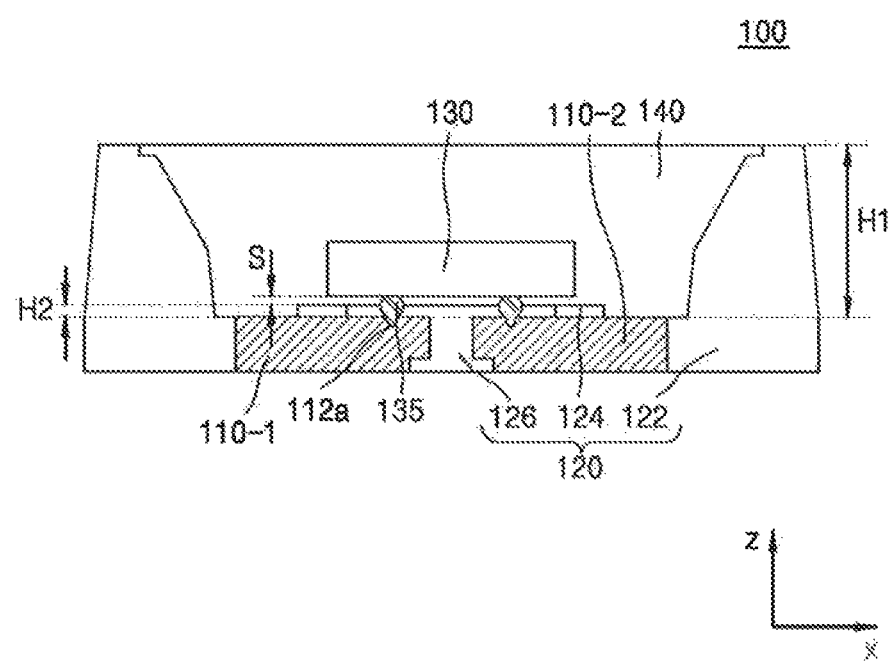
FIGS. 4 and 5 are cross-sectional views of the light-emitting device package of FIG. 2 taken along lines II-II' and III-III', respectively, and are cross-sectional views including a light-emitting device chip.
Figure 5:
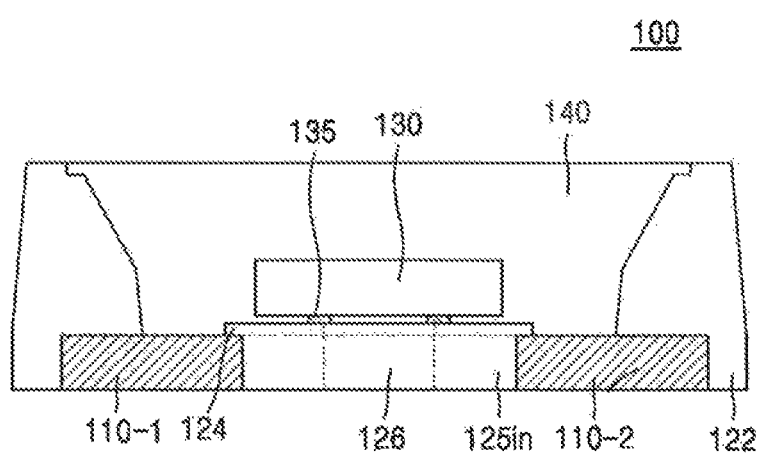

The inner barrier 124 may be integrally connected to a portion of the molding structure 120 that fills the inner slot SLin and the outer slot SLout, as seen in FIGS. 3C, 4, and 5. An electrode separator 126, the inner slot SLin and the outer slot SLout of the lead frame 110 may be first filled with a molding material having fluidity in the molding process of forming the molding structure 120 using a mold. Then, a portion of a passage on the upper surface of the lead frame 110 may be filled with the molding material so that the inner barrier 124 may be formed. Accordingly, the inner barrier 124 may be relatively easily formed in a desired shape. For example, the presence of the slots SLin and SLout may greatly improve extrudability of the portion of the inner barrier 124.

More specifically, if the slots SLin and SLout do not exist in the first and second leads 110-1 and 110-2 of the lead frame 110, the molding material having fluidity may flow through a passage corresponding to the electrode separator 126 between the first lead 110-1 and the second lead 110-2 so that the electrode separator 126 may be first filled with the molding material. Also, a thin rectangular ring passage on the top surface of the lead frame 110 may be filled with the molding material so that the inner barrier 124 may be formed. However, it may not be easy to fill the thin rectangular ring passage with the molding material completely. That is, the extrudability may be reduced at a portion corresponding to the inner barrier 124, and thus the inner barrier 124 may not have a desired shape and rigidity. On the other hand, if the slots SLin and SLout exist in the first and second leads 110-1 and 110-2 of the lead frame 110 as in the light-emitting device package 100 of the present embodiment, the portion of the slots SLin and SLout may be used as the passage through which the molding material flows, and an upper portion of the molding material filling the slots SLin and SLout may constitute a part of the inner barrier 124. Thus, the inner barrier 124 may be easily formed in a desired shape, and may also have a relatively high rigidity.

For example, the thin ring passage may be a very short portion between the inner slot SLin and the outer slot SLout, and may correspond to a portion adjacent to an edge portion of the inner barrier 124.

The electrode separator 126 may be a portion that fills a gap between the first lead 110-1 and the second lead 110-2, and may electrically and physically separate the first lead 110-1 and the second lead 110-2 from each other. As seen from FIGS. 3A and 3B, the electrode separator 126 may have a broad width at the outer portion corresponding to the second area Aout and a narrow width at the inner portion corresponding to the first area Ain. Since a width of the outer portion of the electrode separator 126 is designed to be broad, the molding process may proceed smoothly. In addition, since a width of the inner portion of the electrode separator 126 is designed to be narrow, a flip-chip bonding process may be smoothly performed according to a size of the light-emitting device chip 130 that is being miniaturized.

As seen from FIGS. 3C and FIG. 5, the electrode separator 126 may be integrally connected to an inner slot molding part 125in of the molding structure 120 filling the inner slot SLin. Also, the inner slot molding part 125in may be integrally connected to the inner barrier 124. The outer slot SLout may be filled with an outer slot molding part 125out. The outer slot molding part 125out may be integrally connected to the outer barrier 122 at the outer portion of the lead frame 110 and may be integrally connected to the inner barrier 124 adjacent to the first area Ain.

As seen from FIG. 3C, the electrode separator 126, the inner slot molding part 125in, and the outer slot molding part 125out may have widths of lower surface larger than those of upper surface. However, in some embodiments, the electrode separator 126, the inner slot molding portion 125in, and the outer slot molding portion 125out may be formed to have substantially the same width on the lower surface and the upper surface. In other embodiments, the widths of the electrode separator 126, the inner slot molding portion 125in, and the outer slot molding portion 125out may be gradually widened from the upper surface toward the lower surface.

The light-emitting device chip 130 may be mounted on the first area Ain of the lead frame 110 in a flip-chip structure. The light-emitting device chip 130 may be, for example, a light-emitting diode (LED) chip. The light-emitting device chip 130 may include a first conductive semiconductor layer, an active layer, and a second conductive semiconductor layer. In the light-emitting device package 100 of the present embodiment, the light-emitting device chip 130 may include all structures that may be mounted in the flip-chip structure on the lead frame 110. Various structures, characteristics, and the like of the light-emitting device chip 130 are already known, and detailed descriptions thereof are omitted. In descriptions of FIGS. 4 and 5, the flip-chip structure of the light-emitting device chip 130 will be described in more detail.

FIGS. 3 and 5 are cross-sectional views of the light-emitting device package 100 of FIG. 2 taken along lines II-II' and III-III', respectively, and are cross-sectional views including a light-emitting device chip. For convenience of understanding, the description will be made with reference to FIGS. 1 to 3C together.

Referring to FIGS. 4 and 5, in the light-emitting device package 100 of the present embodiment, the light-emitting device chip 130 may be mounted on the first area Ain of the lead frame 110 in a flip-chip structure. The flip-chip structure may refer to a structure in which the light-emitting device chip 130 is mounted on the lead frame 110 such that an active surface of the light-emitting device chip 130 faces a top surface of the lead frame 110. In the light-emitting device package 100 of the present embodiment, the light-emitting device chip 130 may be mounted in the flip-chip structure on the first area Ain of the lead frame 110 using a solder ball 135.

As described above, the groove 112 may be formed in the first area Ain of the lead frame 110, and may include the first groove 112a and the second groove 112b. The solder ball 135 may be positioned in the first groove 112a and may be used to mount the light-emitting device chip 130 on the first area Ain or the lead frame 110. The light-emitting device chip 130 may be coupled to the lead frame 110 in the flip-chip structure by using the solder ball 135 positioned in the first groove 112a. Thus, coupling between the light-emitting device chip 130 and the lead frame 110 may be strengthened.

More specifically, the solder ball 135 may be positioned to fill an inner portion of the first grove 112a. Accordingly, a contact area between the solder ball 135 and the lead frame 110 may relatively increase rather than a case where the solder ball 135 is directly positioned on the lead frame 110 that does not have the first groove 112a. An increase in the contact area between the solder ball 135 and the lead frame 110 may contribute to a strengthening of the coupling between the light-emitting device chip 130 and the lead frame 110 by the solder ball 135. A crack may be generated in the solder ball 135 due to a stress caused by a difference in physical properties between the light-emitting device chip 130 and the lead frame 110. The crack may progress to cause the solder ball 135 to be separated from the lead frame 110. However, in the light-emitting device package 100 of the present embodiment, since the solder ball 135 is positioned in the first groove 112a, the contact area between the solder ball 135 and the lead frame 110 may increase. When the crack occurs, the solder ball 135 may not be separated from the lead frame 110 by preventing the crack from progressing in the first groove 112a. Therefore, in the light-emitting device package 100 of the present embodiment, the connection failure between the light-emitting device chip 130 and the lead frame 110 may be improved, and reliability of the light-emitting device package 100 may be improved.

As shown in FIGS. 4 and 5, the outer barrier 122 may have a first height H1 from a top surface of the lead frame 110, and the inner barrier 124 may have a second height H2 from the top surface of the lead frame 110. The first height H1 of the outer partition 122 may be much larger than the second height H2 of the inner partition 124 as shown in FIGS. 4 and 5.

The first height H1 of the outer barrier 122 may be determined by considering a thickness of the light-emitting device chip 130, a thickness of the fluorescent layer 140 of FIG. 4, light extraction efficiency, and the like as a whole. For example, the first height H1 of the outer barrier 122 may be 400 μm or more.

The second height H2 of the inner barrier 124 may be sufficient to physically separate the first area Ain and the second area Ain. The second height H2 of the inner barrier 124 may be determined in consideration of excludability of a molding process of a portion existing only on the upper surface of the lead frame 110. For example, the second height H2 of the inner barrier 124 may be several tens of micrometers.

The light-emitting device chip 130 may be mounted on the first area Ain of the lead frame 110 in such a manner that a part of the light-emitting device chip 130 overlaps with the inner barrier 124 in a first direction (e.g., an X-axis direction) and a second direction (e.g., a Y-axis direction). In other words, a horizontal cross section of the light-emitting device chip 130 may be larger than the first area Ain surrounded by the inner barrier 124. Meanwhile, as shown in FIG. 4, a first space S may be maintained between the light-emitting device chip 130 and the inner barrier 124. For example, the first space S may be very fine of several micrometers. As described above, since a space between the light-emitting device chip 130 and the inner barrier 124 may be kept very narrow, and thus light may be prevented from flowing between the light-emitting device chip 130 and the lead frame 110, thereby minimizing absorption of light by a solder ball, etc. and increasing, the light extraction efficiency. Meanwhile, in some embodiments, the light-emitting device chip 130 may be mounted on the first area Ain of the lead frame 110 so as to be in contact with the inner barrier 124, and thus the space between the light-emitting device chip 130 and the inner barrier 124 may not be present.

The fluorescent layer 140 covering the light-emitting device chip 130 may be arranged in the outer barrier 122. The fluorescent layer 140 may be electrically insulated and may be formed of resin containing a wavelength conversion material. For example, the wavelength conversion material may be a fluorescent material, and the resin may be a silicone resin, an epoxy resin, or a mixed resin thereof.

The fluorescent layer 140 may include two or more materials that provide light of different wavelengths. In some embodiments, the fluorescent layer 140 may be formed of a mixture of green fluorescent powder and red fluorescent powder. Further, in same other embodiments, the phosphor layer 140 may have a structure in which a plurality of wavelength conversion layers are stacked. For example, the fluorescent layer 140 may have a structure in which a first wavelength conversion layer that outputs green light and a second wavelength conversion layer that outputs red light are stacked. The fluorescent layer 140 may convert light generated in the light-emitting device chip 130 into white light or light having a specific wavelength.

On the other hand, in some embodiments, the fluorescent layer 140 may be omitted. Further, in some other embodiments, a microlens may be arranged on the fluorescent layer 140.

In the light-emitting device package 100 of the present embodiment, since the slots SLin and SLout are formed in the lead frame 110, stress due to a difference in physical properties between the lead frame 110 and the molding structure 120 may be alleviated, and coupling between the flame 110 and the molding structure 120 may be made rigid. Accordingly, a reliability of the light-emitting device package 100 may be improved.

In addition, in a molding process for forming the molding structure 120, the slots SLin and SLout of the lead frame 110 may function to expand a passage through which molding materials in a fluid state flow, such that an extrudability of the molding process may be improved. Thus, a rigidity of the molding structure 120 may be enhanced, thereby contributing to an improvement of the reliability of the light-emitting device package 100.

In addition, in the light-emitting device package 100 of the present embodiment, the groove 112 may be formed in the first area Ain of the lead frame 110, and the solder ball 135 may be positioned in the groove 112 to mount the device chip 130 on the lead frame 110 in a flip-chip structure. Thus, a coupling between the light-emitting device chip 130 and the lead frame 110 may be enhanced. Therefore, the reliability of the light-emitting device package 100 may be improved.

Figure 6A:
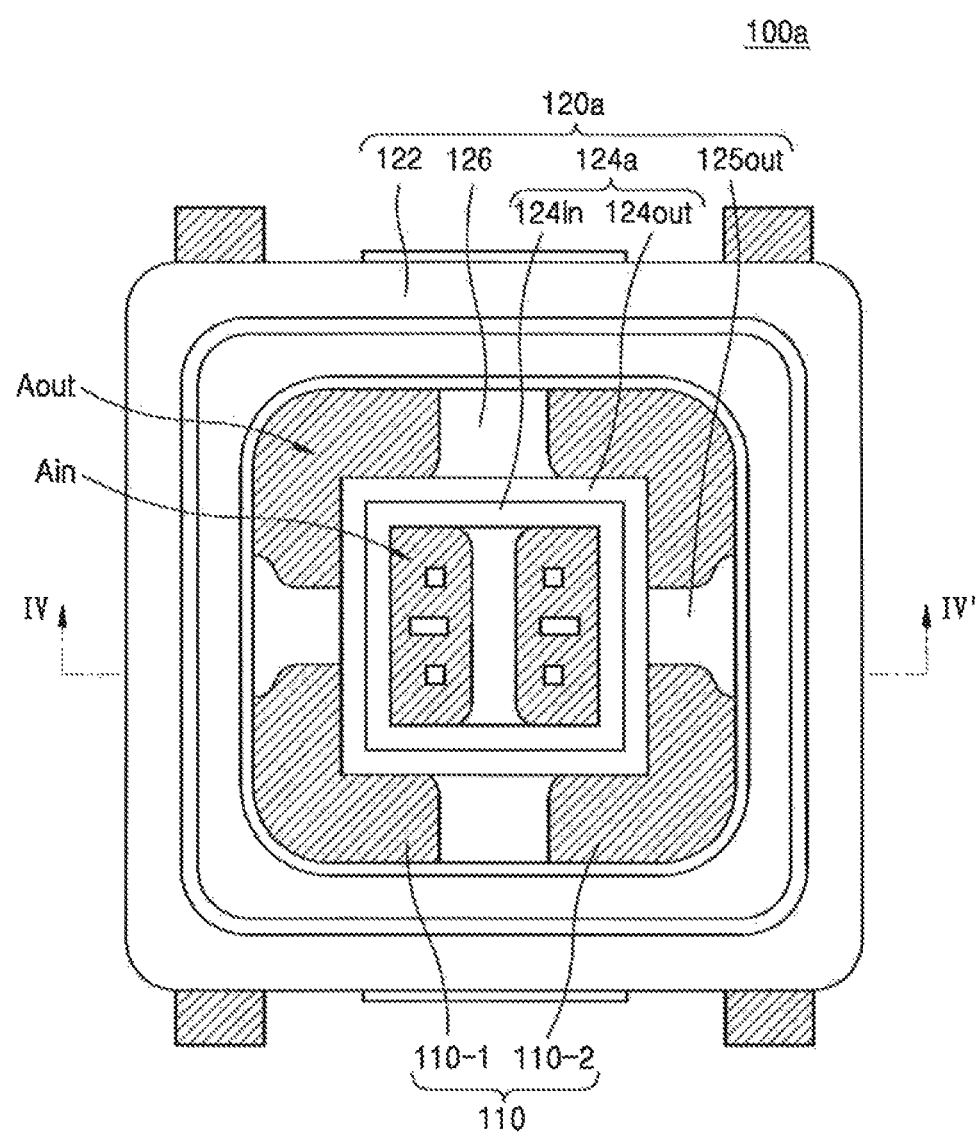
FIG. 6A is a plan view of a light-emitting device package according to an embodiment and is a plan view corresponding to FIG. 3B.
Figure 6B:
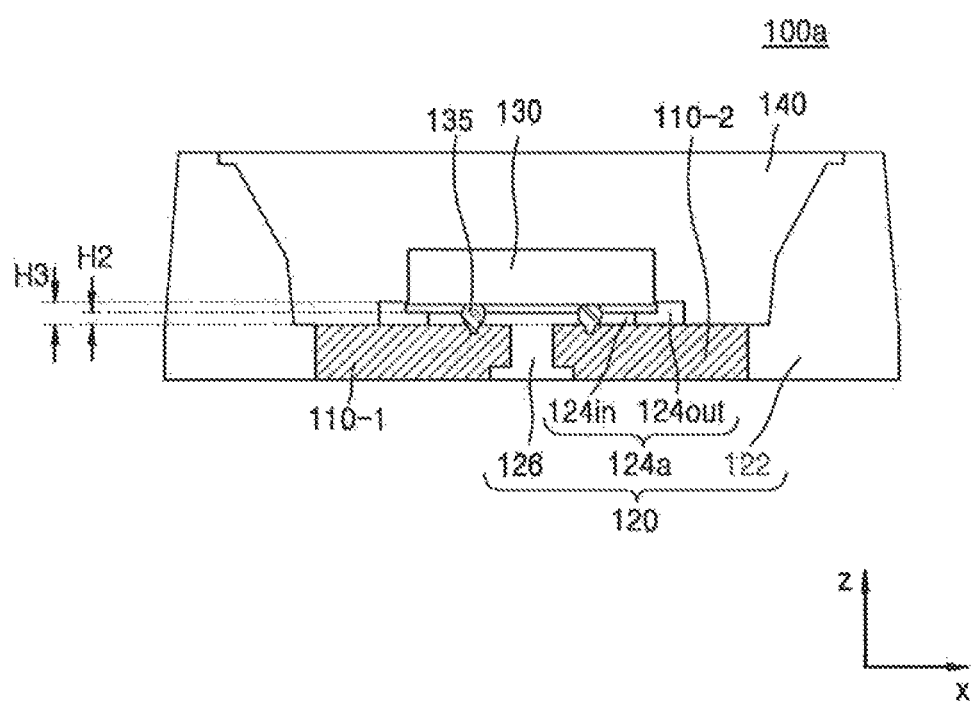
FIG. 6B is a cross-sectional view of the light-emitting device package of FIG. 6A taken along a line IV-IV' and includes a light-emitting device chip.

FIG. 6A is a plan view of a light-emitting device package 100a according to an embodiment, and is a plan view corresponding to FIG. 3B. FIG. 6B is a cross-sectional view of the light-emitting device package 100a of FIG. 6A taken along a line IV-IV' and includes the light-emitting device chip 130.

Referring to FIGS. 6A and 6B, the light-emitting device package 100a of the present embodiment may be different from the light-emitting device package 100 of FIG. 1. Especially, an inner barrier 124a of a molding structure 120a in FIGS. 6A and 6B is different from the inner barrier 124 of the molding structure 120 in FIG. 1. Specifically, in the light-emitting device package 100a of the present embodiment, the inner barrier 124a of the molding structure 120a may have a step on an upper surface thereof. For example, the inner barrier 124a may be divided into an inner portion 124in adjacent to the first area Ain and an outer portion 124out that is located outside the inner portion 124in. An upper surface of the inner portion 124in may be lower than an upper surface of the outer portion 124out. Accordingly, the upper surface of the inner barrier 124a may have a lower stepped, upper surface of the inner portion 124in, and a higher stepped surface of the outer portion 124out.

Meanwhile, the light-emitting device chip 130 may overlap the inner portion 124in of the inner barrier 124a in a first direction (e.g., an X-axis direction) and a second direction (e.g., a Y-axis direction). The outer portion 124out of the inner barrier 124a may be located outside the light-emitting device chip 130 and may not overlap the light-emitting device chip 130. An upper surface of the outer portion 124out of the inner barrier 124a may be higher than a lower surface of the light-emitting device chip 130. For example, the upper surface of the outer portion 124out of the inner barrier 124a may have a third height H3 from an upper surface of the lead frame 110. The third height H3 may be greater than a distance between the light-emitting device chip 130 and the lead frame 110, that is, a height of the solder ball 135 on the upper surface of the lead frame 110.

However, in some embodiments, the upper surface of the outer portion 124out of the inner barrier 124a may be at the same level as the lower surface of the light-emitting device chip 130, or may be lower than the lower surface of the light-emitting device chip 130.

Figure 7:
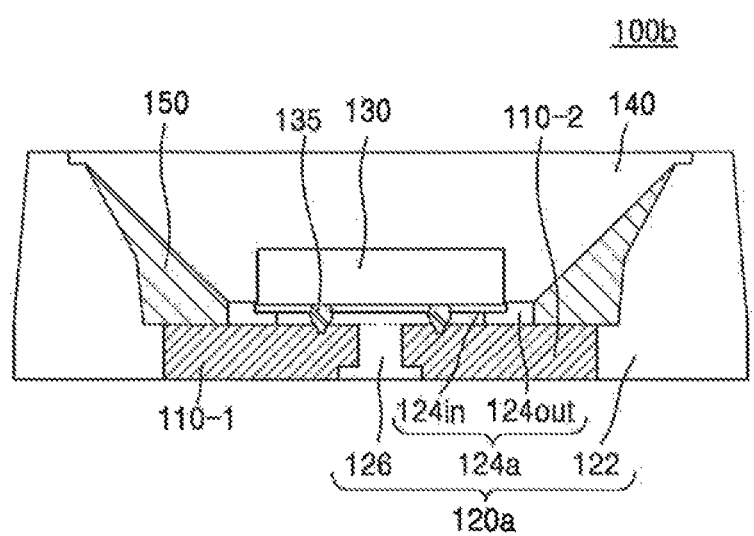
FIG. 7 is a cross-sectional view of a light-emitting device package according to an embodiment, and corresponds to FIG. 6B.

FIG. 7 is a cross-sectional view of a light-emitting device package 100b according to an embodiment, and is a cross-sectional view corresponding to FIG. 6B.

Referring to FIG. 7, the light-emitting device package 100b of the present embodiment may be different from the light-emitting device package 100a of FIG. 6B in that the light-emitting device package 100b further includes a reflective layer 150. Specifically, in the light-emitting device package 100b of the present embodiment, the reflective layer 150 may be formed between an inner wall of the outer barrier 122 and the inner barrier 124a. After, for example, the molding structure 120 is formed through the molding process, the reflective layer 150 may be formed by a suitable structure and size between the inner wall of the outer barrier 122 and the inner barrier 124a through a dispensing process.

The reflective layer 150 may be formed of a material having a high reflectance such as the molding structure 120 described above. For example, the reflective layer 150 may include a highly reflective metal powder such as Al or Ag, or a highly reflective ceramic powder such as $TiO_2$, $Al_2O_3$, $Nb_2O_5$ or ZnO in a resin such as white silicone. Further, the reflective layer 150 may be formed such that an inner surface has an inclination angle for maximizing light reflection efficiency. For example, the inner surface of the reflective layer 150 may have an inclination angle of about 45 degrees to about 55 degrees.

When the reflective layer 150 is formed on the inner wall of the outer barrier 122 as in the light-emitting device package 100*b* of the present embodiment, the molding structure 120*a* may be formed of a general molding resin such as an epoxy resin. In other words, since the reflective layer 150 functions to reflect light generated in the light-emitting device chip 130, the outer barrier 122 of the molding, structure 120*a* does not need to perform a function to reflect light. Since the upper surface of the lead frame 110 is covered by the reflective layer 150, a plating layer of a highly reflective material such as a silver plating layer may be omitted on a part or entirety of the upper surface of the lead frame 110.

In the light-emitting device package 100*b* of the present embodiment, the reflective layer 150 may be formed between the outer barrier 122 and the inner barrier 124*a* that have a step on upper surfaces. However, the reflective layer 150 may not be formed only between the outer barrier 122 and the inner barrier 124*a* that have the step on upper surfaces. For example, as in the light-emitting device package 100 of FIG. 3A, the reflective layer 150 may be formed between the outer barrier 122 and the inner barrier 124 that have no step.

FIGS. 8A through 11B are plan views of light-emitting device packages 100*c*, 100*d*, 100*e*, and 100*f* according to embodiments and plan views illustrating structures of lead frames included in the light-emitting device packages. In FIGS. 8A, 9A, 10A, and 11A, a light-emitting device chip is omitted for convenience of understanding.

Figure 8A:
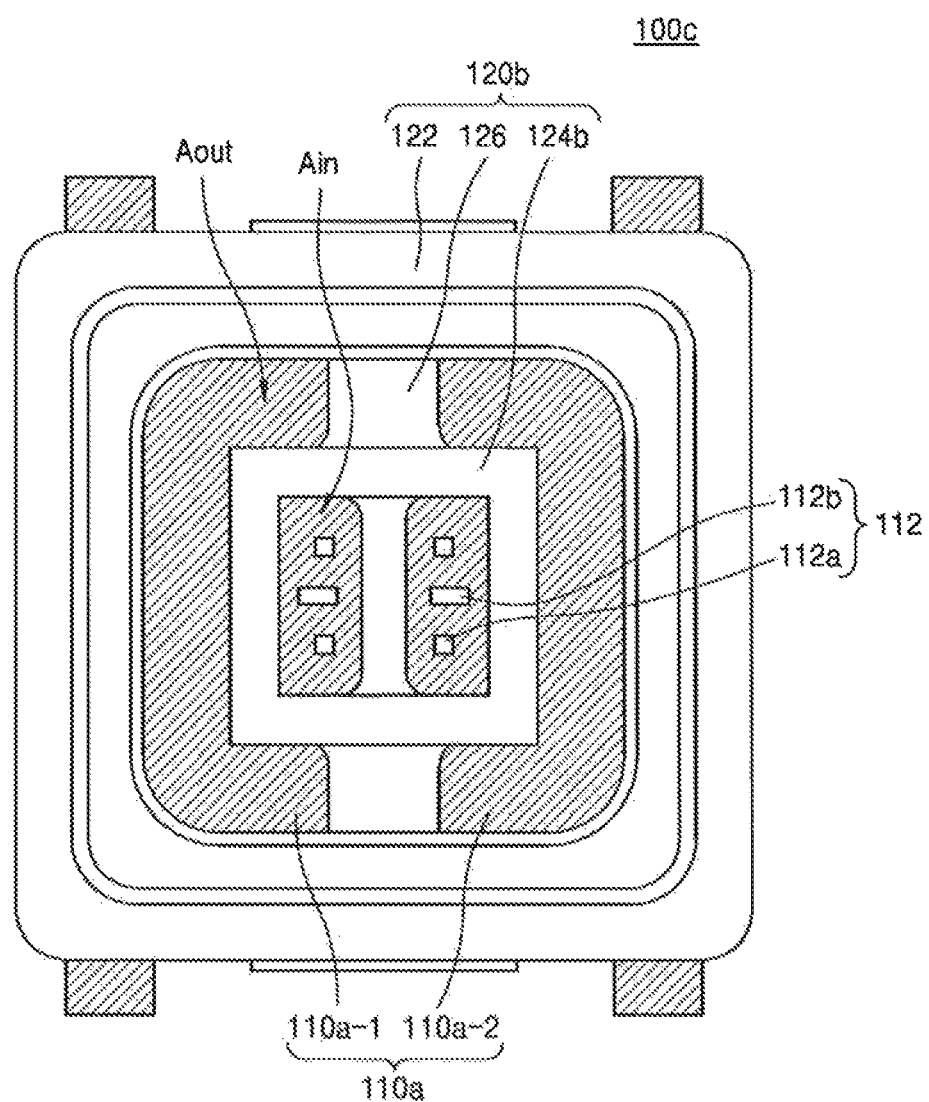
FIGS. 8A through 11B are plan views of light-emitting device packages according to embodiments and illustrate structures of lead frames included in the light-emitting device packages.
Figure 8B:
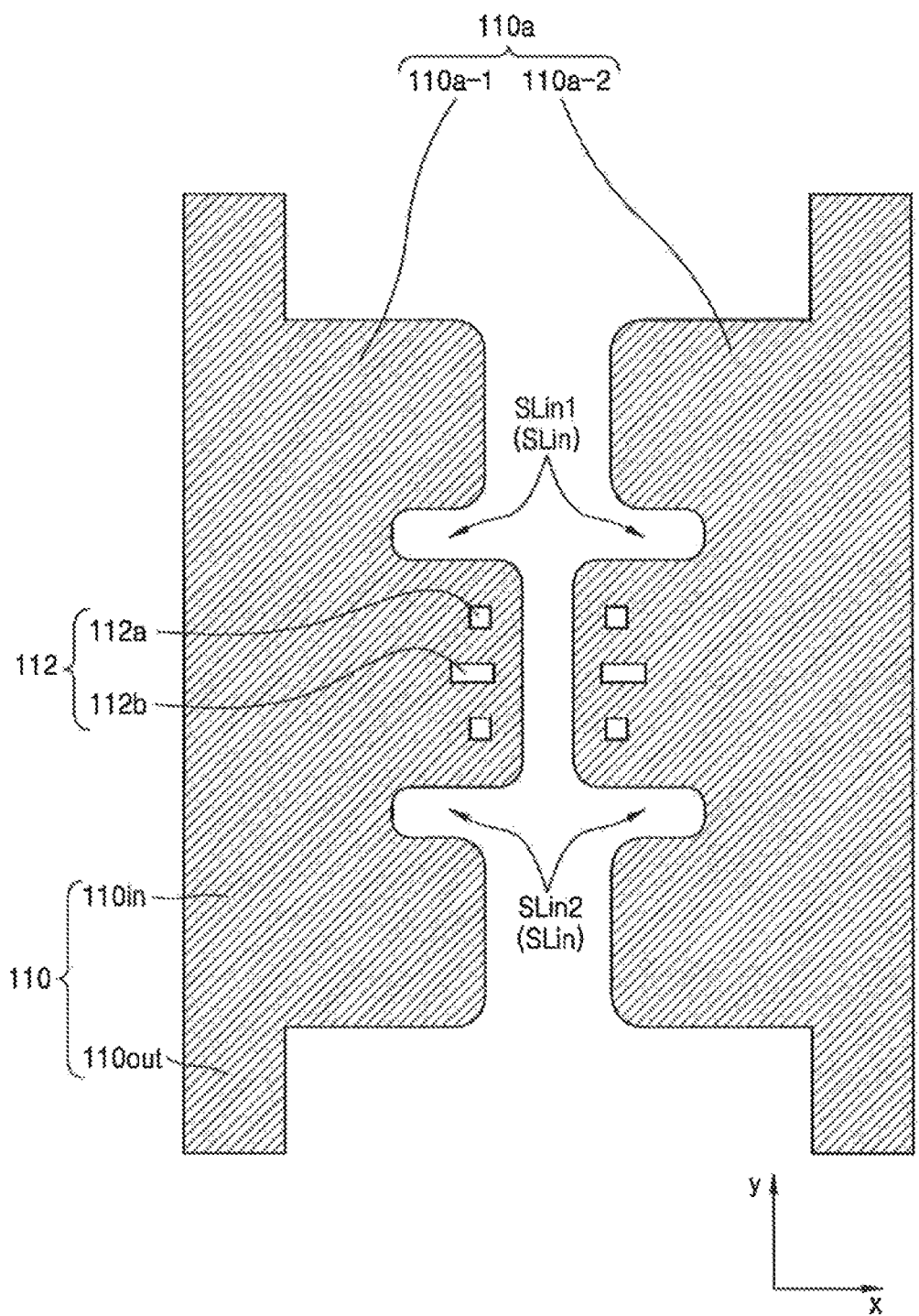

Referring to FIGS. 8A and 8B, the light-emitting device package 100*c* of the present embodiment may be different from the light-emitting device package 100 of FIG. 1. Especially, a lead frame 110*a* in FIGS. 8A and 8B is different from the lead frame 110 in FIG. 1. Specifically, the light-emitting device package 100 of FIG. 1 may include two pairs of inner slots SLin1, SLin2 and a pair of outer slots SLout in a first lead 110-1 and a second lead 110-2 of the lead frame 110. However, in the light-emitting device package 100*c* of the present embodiment, no outer slot may be formed in the first lead 110*a*-1 and the second lead 110*a*-2 of the lead frame 110*a*, and the two pairs of inner slots SLin1, SLin2 may be formed in the first lead 110*a*-1 and the second lead 110*a*-2 of the lead frame 110*a*.

A structure of the molding structure 120*b* of the light-emitting device package 100*c* of the present embodiment may be also different from that of the molding structure 120 of the light-emitting device package 100 of FIG. 1 due to a structural difference of the lead frame 110*a*. For example, in the light-emitting device package 100*c* of the present embodiment, since no outer slot is formed in the lead frame 110*a*, the molding structure 120*b* may not include an outer slot molding portion. In addition, due to an absence of the outer slot, both sides of an inner barrier 124*b* extending in a second direction (e.g., a Y-axis direction) may be formed thin on the lead frame 110*a*. In other words, in the case of the light-emitting device package 100 of FIG. 1, the outer slot molding portion 125out of FIG. 3A and both sides extending in the second direction (e.g., the Y-axis direction) of the inner barrier 124*b* may be integrally connected at a center portion, and both sides of the inner barrier 124*b* extending in the second direction (e.g., the Y-axis direction) may extend to a lower surface of the lead frame 110 through the outer slot molding part 125out. However, in the light-emitting device package 100*c* of the present embodiment, both sides of the internal barrier 124*b* extending in the second direction (e.g., the Y-axis direction) may be formed only on an upper surface of the lead frame 110*a* without expanding to the lower surface of the lead frame 110*a* because no outer slot molding portion is present.

In the light-emitting device package 100*c* of the present embodiment, on the other hand, the lead frame 110*a* inside the outer barrier 122 may be divided into the first area Ain and the second area Aout by the inner barrier 124*b*. The light-emitting device chip 130 may be mounted in a flip-chip structure on the first area Ain of the lead frame 110*a*. The light-emitting device chip 130 may be mounted in a flip-flop structure on the first area Am of the lead frame 110*a* by using the solder ball 135 positioned in the groove 112 formed in the lead frame 110*a*, that is, the first groove 112*a*.

Figure 9A:
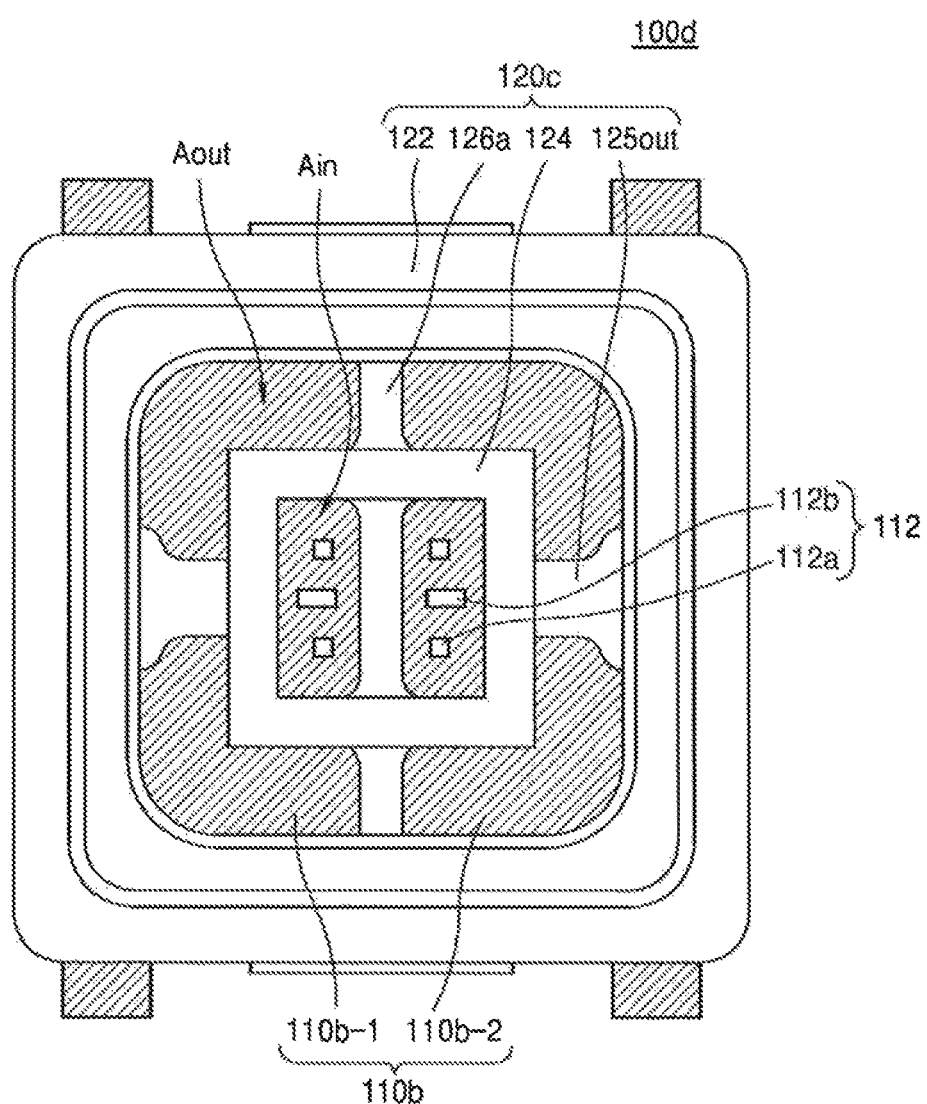
Figure 9B:
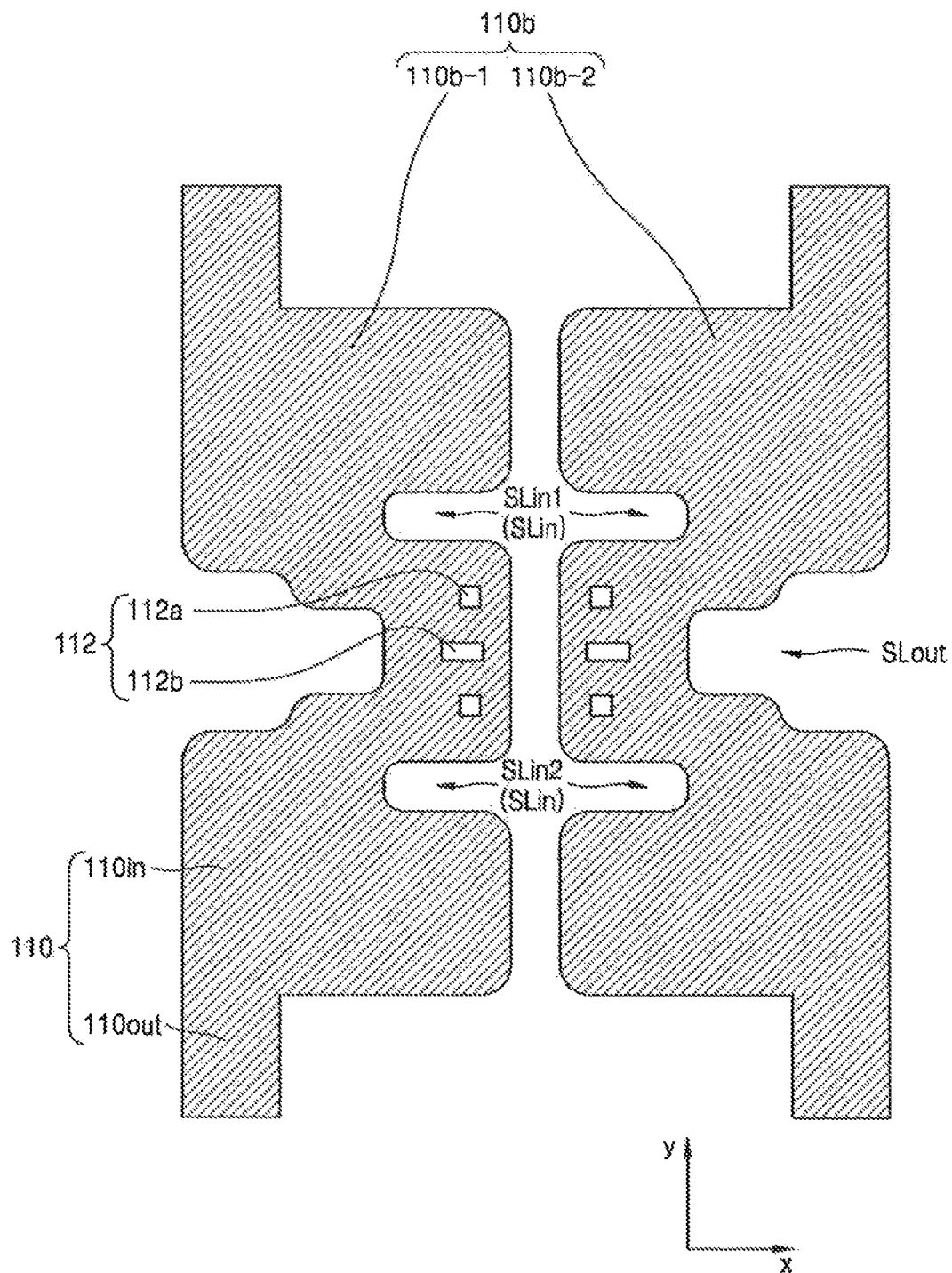

Referring to FIGS. 9A and 9B, the light-emitting device package 100*d* of the present embodiment may be different from the light-emitting device package 100 of FIG. 1. Especially, the lead frame 110*b* in FIGS. 9A and 9B is different from the lead frame 110 in FIG. 1. Specifically, the light-emitting device package 100 of FIG. 1 may have a structure in which the first lead 110-1 and the second lead 110-2 of the lead frame 110 are spaced apart at a narrow interval in an inner portion corresponding to the first area Ain, and are spaced apart at a wide interval in an outer portion corresponding to the second area Aout. On the other hand, the light-emitting device package 100*d* of the present embodiment may have a structure in which the first lead 110*b*-1 and the second lead 110*b*-2 of the lead frame 110*b* may be spaced apart at an equal interval irrespective of the inner portion or the outer portion.

A structure of the molding structure 120*c* of the light-emitting device package 100*d* of the present embodiment may be different from that of the molding structure 120 of the light-emitting device package 100 of FIG. 1 due to a structural difference of the lead frame 110*b*. For example, in the light-emitting device package 100*d* of the present embodiment, since the first lead 110*b*-1 and the second lead 110*b*-2 of the lead frame 110*b* are spaced apart at an equal interval irrespective of their positions, an electrode separator 126*a* of the molding structure 120*c* may also have the corresponding same width and extend in the second direction (e.g., the Y-axis direction).

In addition, a region division of the lead frame 110*b* by the inner barrier 124 and a structure of the inner barrier 124, the inner slot molding portion 125in, the outer slot molding portion 125out, the groove 112 in the first area Ain of the lead frame 110*b*, and mounting of a flip-chip structure of the light-emitting device chip 130 by using the solder ball 135 positioned in the groove 112 are the same as described with reference to FIGS. 1 through 5.

Figure 10A:
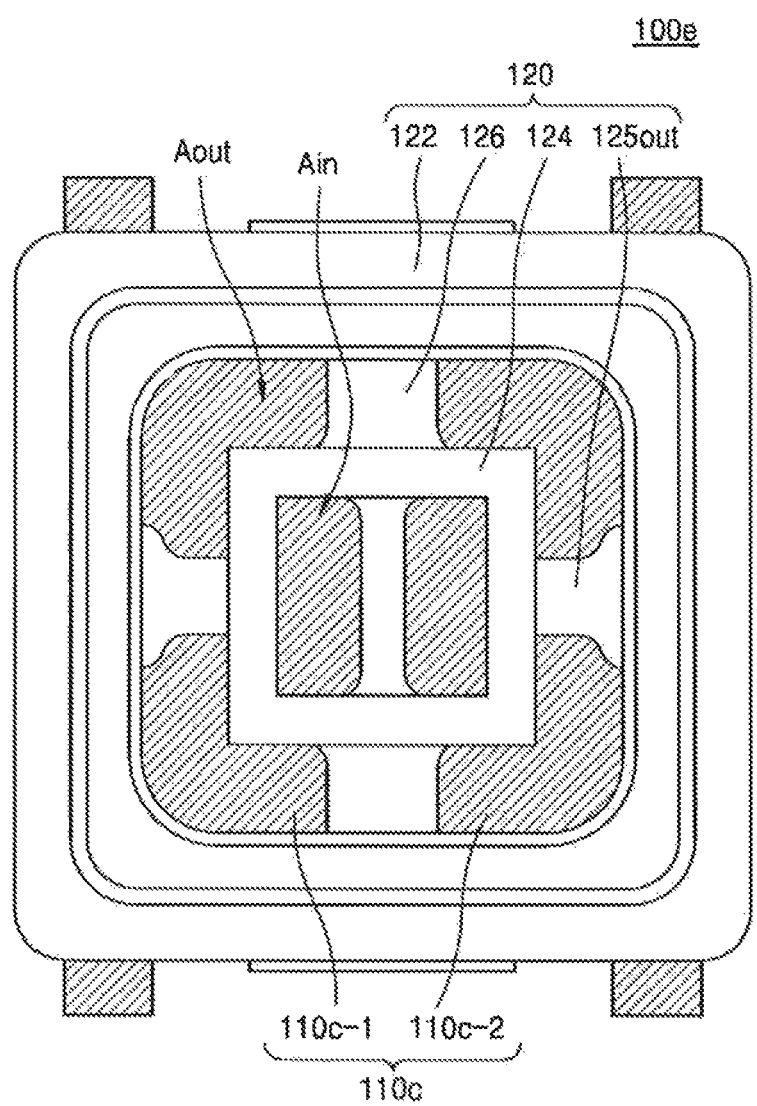
Figure 10B:
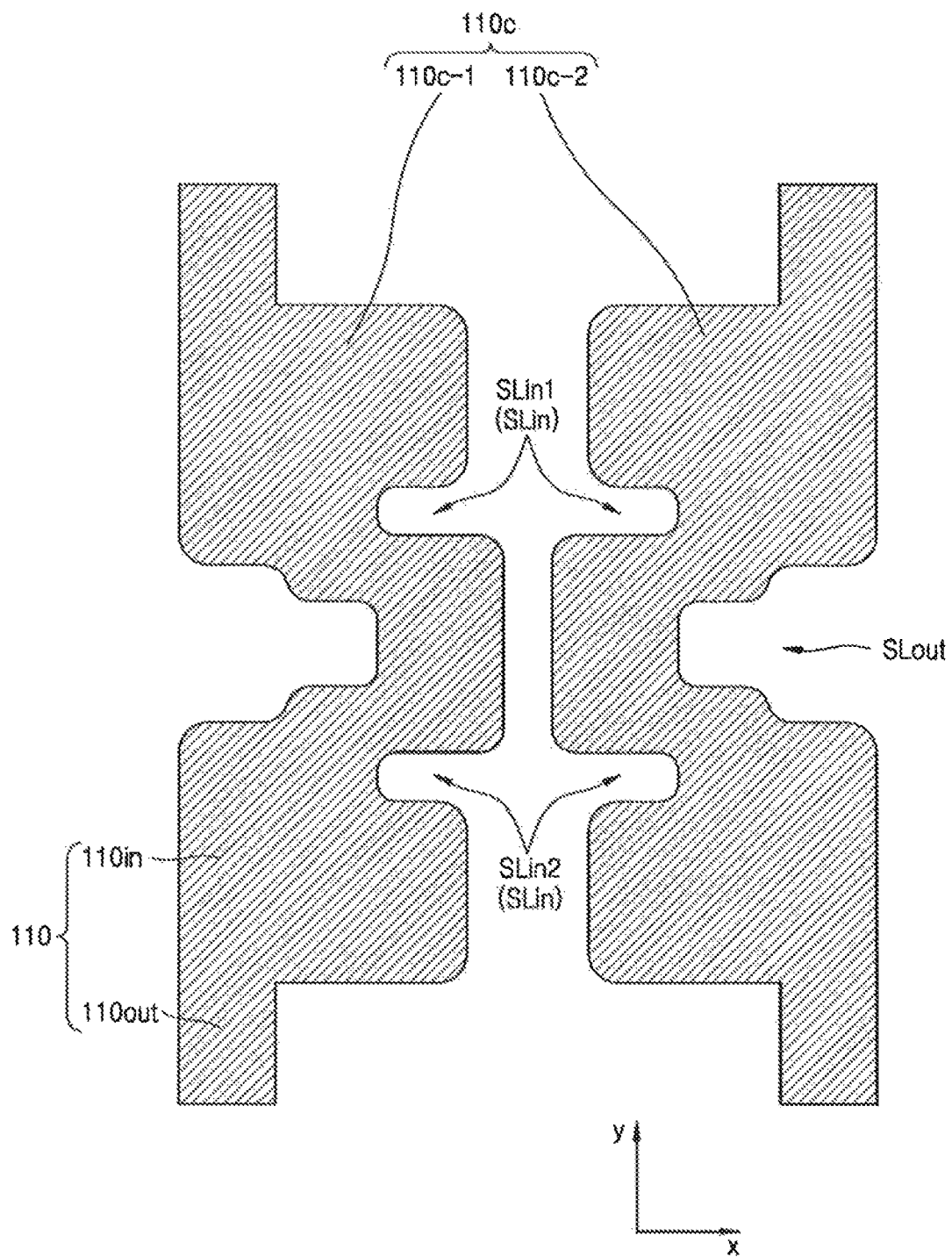

Referring to FIGS. 10A and 10B, the light-emitting device package 100*e* of the present embodiment may be different from the light-emitting device package 100 of FIG. 1. Especially, the lead frame 110*c* in FIGS. 10A and 10B is different from the lead frame 110 in FIG. 1. Specifically, in the light-emitting device package 100 of FIG. 1, the groove 112 may be formed in the first area Ain of the first lead 110-1 and the second lead 110-2 of the lead frame 110. The light emitting device chip 130 may be mounted in a flip-chip structure on the lead frame 110 by using the solder ball 135 positioned in the groove 112, for example, the first groove 112*a*. On the contrary, in the light-emitting device package 100*e* of the present embodiment, a separate groove may not be formed in the first area Ain of the first lead 110*c*-1 and the second lead 110*c*-2 of the lead frame 110*c*. Accordingly, in the light-emitting device package 100*e* of the present embodiment, the light-emitting device chip 130 ma be mounted in a flip-chip structure by using a solder ball positioned on a flat upper surface of the first area Ain of the lead frame 110*c*.

In addition, a region division of the lead frame 110*c* by the inner barrier 124 and a structure of the inner barrier 124, the electrode separation portion 126 the inner slot molding portion 125in, the outer slot molding portion 125out, etc. may be the same as described with reference to FIGS. 1 through 5.

Figure 11A:
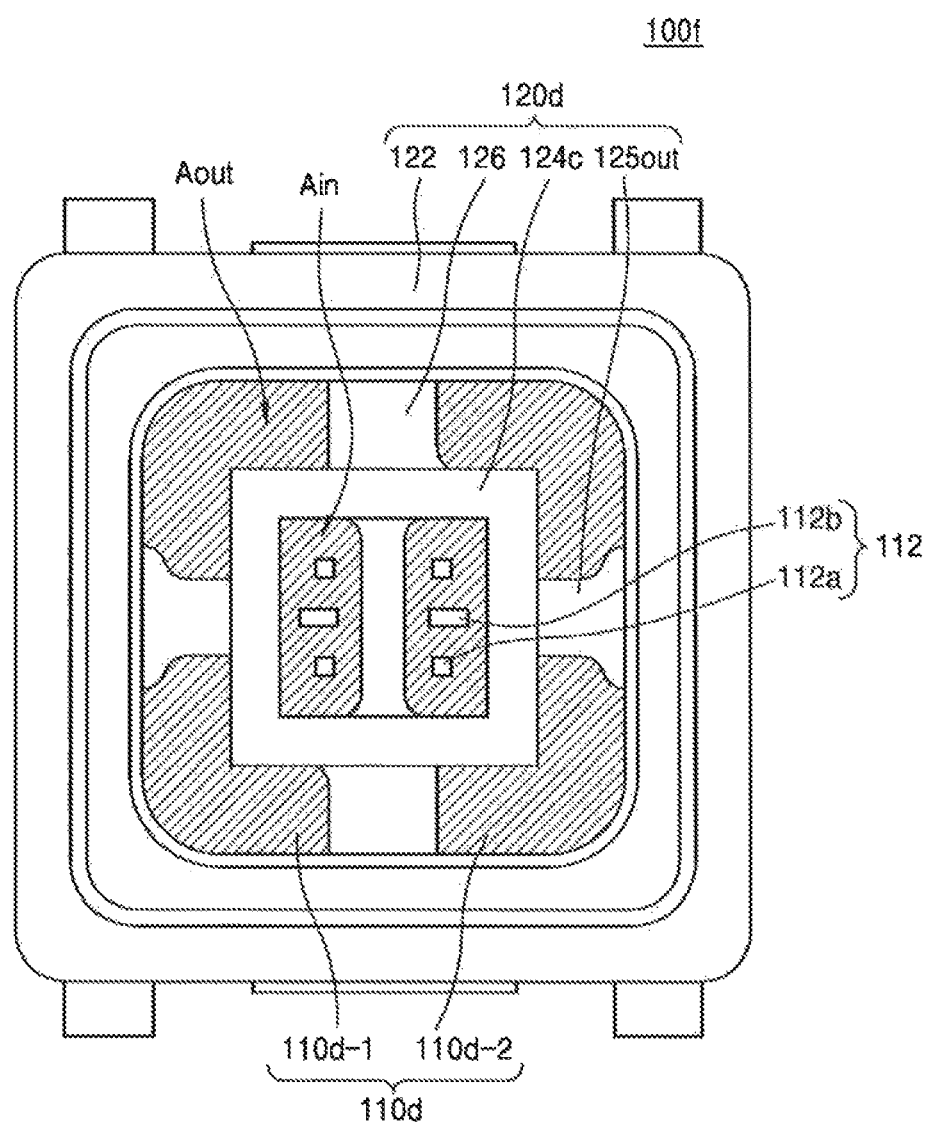
Figure 11B:
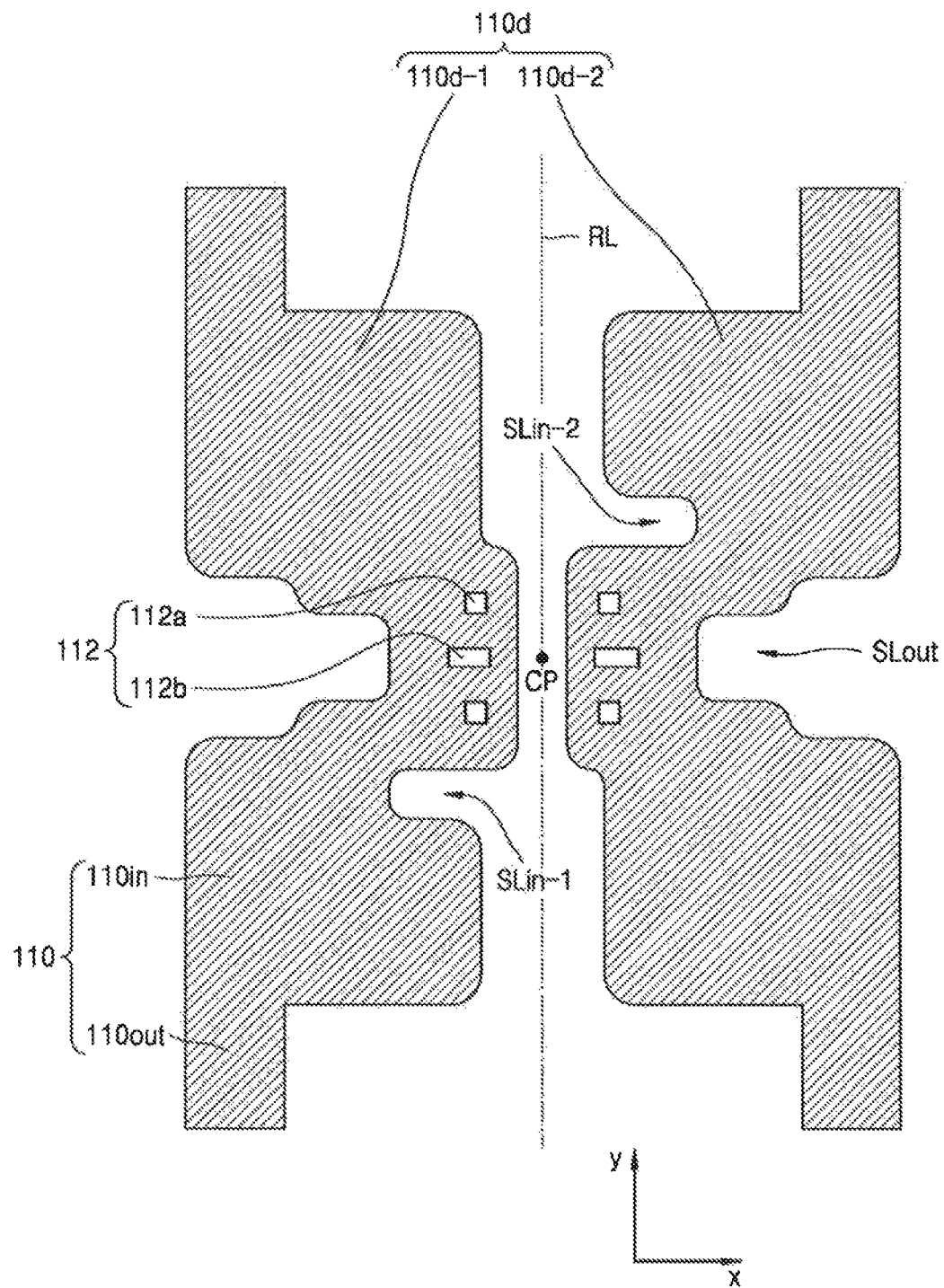

Referring to FIGS. 11A and 11B, the light-emitting device package 100*f* of the present embodiment may be different from the light-emitting device packages 100 of FIG. Especially, a lead frame 110*d* in FIGS. 11A and 11B is different from the lead frame 110 in FIG. 1. Specifically, in the light-emitting device package 100 of FIG. 1, two pairs of inner slots SLin1 and SLin2 and a pair of outer slots SLout may be formed in the first lead 110-1 and the second lead 110-2 of die lead frame 110. However, in the light-emitting device package 100*e* of the present embodiment, one inner slot SLin-1, one inner slot SLin-2 and a pair of outer slots SLout may be respectively formed in a first lead 110*d*-1 and a second lead 110*d*-2 of the lead frame 110*d*.

The inner slot SLin-1 formed in the first lead 110*d*-1 and the inner slot SLin-2 formed in the second lead 110*d*-2 may be formed in a point-symmetrical structure with respect to a center point CP. In other words, the light-emitting device package 100*f* of the present embodiment may have a pair of inner slots SLin-1 and SLin-2 that are point symmetrical with respect to the center point CP and a pair of outer slots SLout that are line symmetrical with respect to the reference line RL.

The structure of the molding structure 120*d* of the light-emitting device package 100*f* of the present embodiment may be different from the structure of the molding structure 120 of the light-emitting device package 100 of FIG. 1 due to a structural difference of the lead frame 110*d*. For example, in the light-emitting device package 1001 of the present embodiment, only one inner slot may be formed in each of the first lead 110*d*-1 and the second lead 110*d*-2, and the inner slot molding portion 125 of FIG. 3 of the molding structure 120*d* may be formed only in one part of each of the first and second leads 110*d*-1 and 110*d*-2 in correspondence to a position of the inner slot.

In addition, side portions of an inner barrier 124*c* extending in a first direction (e.g., a X-axis direction) in a portion having no inner slot may be formed to have a thin thickness on the lead frame 110*a*. In other words, since an inner slot molding portion is not present in the portion having no inner slot, the side portions of the inner barrier 124*c* in the first direction (e.g., the X-axis direction) may not extend to a lower surface of the lead frame 110*d* and may be formed on an upper surface of the led frame 110*d*.

In addition, a region division of the lead frame 110*d* by the inner barrier 124*c*, the electrode separator 126, the outer slot molding portion 125out, the groove 112 in the first area Ain of the lead frame 110*d*, and mounting of a flip-chip structure of the light-emitting device chip 130 by using the solder ball 135 positioned in the groove 112 are the same as described with reference to FIGS. 1 to 5.

Figure 12:
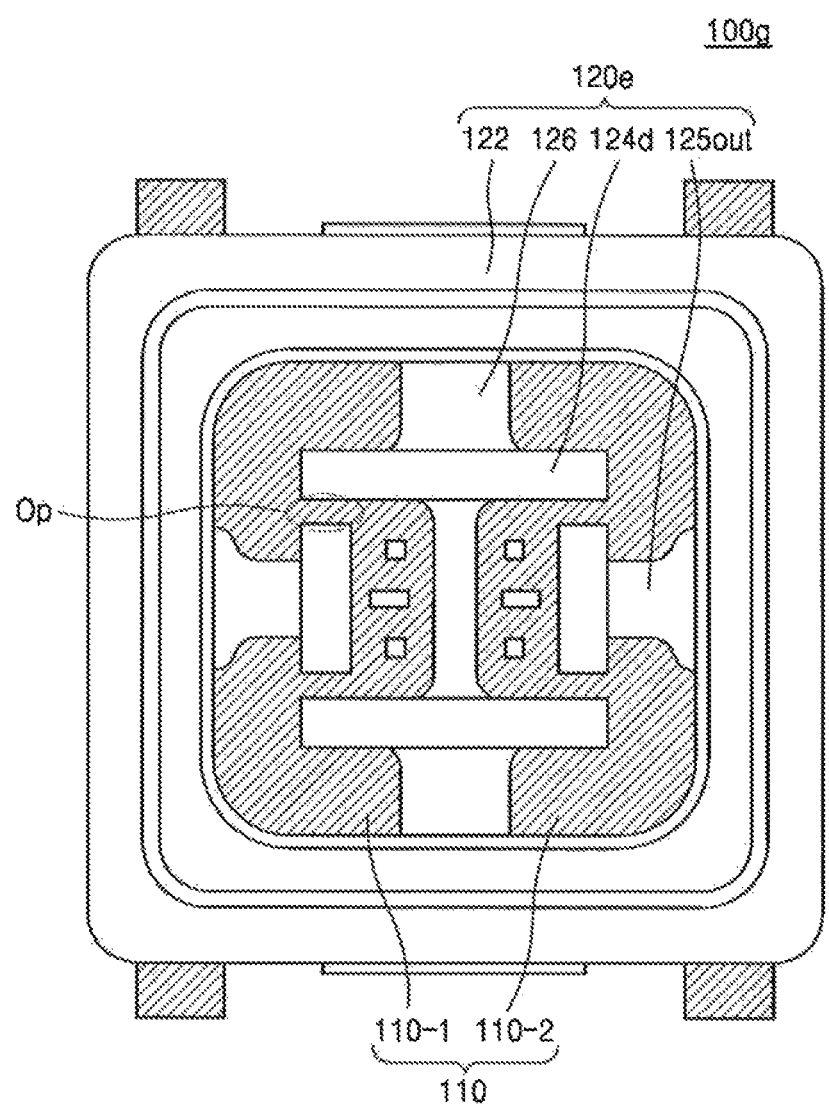
FIG. 12 is a plan view of a light-emitting device package according to an embodiment, and is corresponds to FIG. 3B.

FIG. 12 is a plan view of a light-emitting device package 100*g* according to an embodiment, and is a plan view corresponding to FIG. 3B.

Referring to FIG. 12, the light-emitting device package 100*g* of the present embodiment may be different from the light-emitting device package 100 of FIG. 1. Especially, an inner barrier 124*d* of a molding structure 120*e* in FIG. 12 is different from the inner barrier 124 in FIG. 1. Specifically, in the light-emitting device package 100 of FIG. 1, the inner barrier 124 of the molding structure 120 may have a rectangular closed ring shape. Accordingly, the first area Ain and the second area Aout of the lead frame 110 may be completely separated from each other by the inner barrier 124 when viewed from above. In contrast, in the light-emitting device package 100*g* of the present embodiment, the inner barrier 124*d* of the molding structure 120*e* may have a rectangular open ring shape in which openings Op are arranged in parts of sides of the inner barrier 124*d*. Accordingly, the first area Ain and the second area Aout of the lead frame 110*e* may have a structure in which the first area Ain and the second area Aout are connected to each other through the openings Op.

A structure of the lead frame 110 of the light-emitting device package 100*g* of the present embodiment may be substantially the same as a structure of the lead frame 110 of the light-emitting device package 100 of FIG. 1. However, since the inner barrier 124*d* is formed only in an adjacent portion in the inner slot Snit and the outer slot SLout, an extrudability in a molding process may be improved. For example, in the light-emitting device package 100*g* of the present embodiment, the inner barrier 124*d* may be formed only on an upper portion of a portion corresponding to the inner slot SLin and the outer slot S Lout, and may not be formed on an upper surface of the lead frame 110 of a portion corresponding to the openings Op. Since an inner barrier in the portion corresponding to the openings Op may be formed only on the upper surface of the lead frame 110 in the light-emitting device package 100 of FIG. 1, when a thickness of the inner barrier is small, the portion may not be completely filled with a molding material in the molding process. Accordingly, the extrudability of the molding process may be lowered. However, in the light-emitting device package 100*g* of the present embodiment, since the inner barrier is not formed in the portion corresponding to the openings Op, it may not be necessary to fill the portion with the molding material. Therefore, the extrudabilty of the molding process may be improved.

Figure 13A:
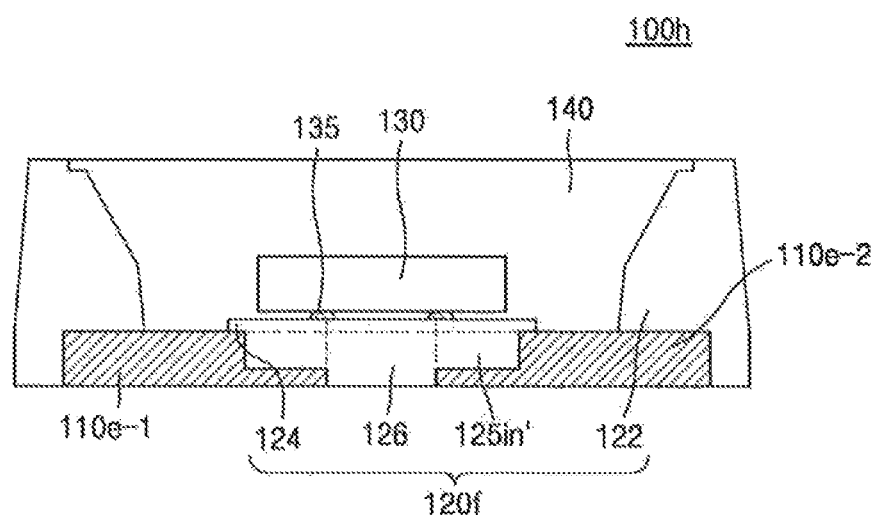
FIGS. 13A and 13B are respectively a cross-sectional view of a light-emitting device package and a plan view showing a structure of a lead frame included in the light-emitting device package according to an embodiment.
Figure 13B:
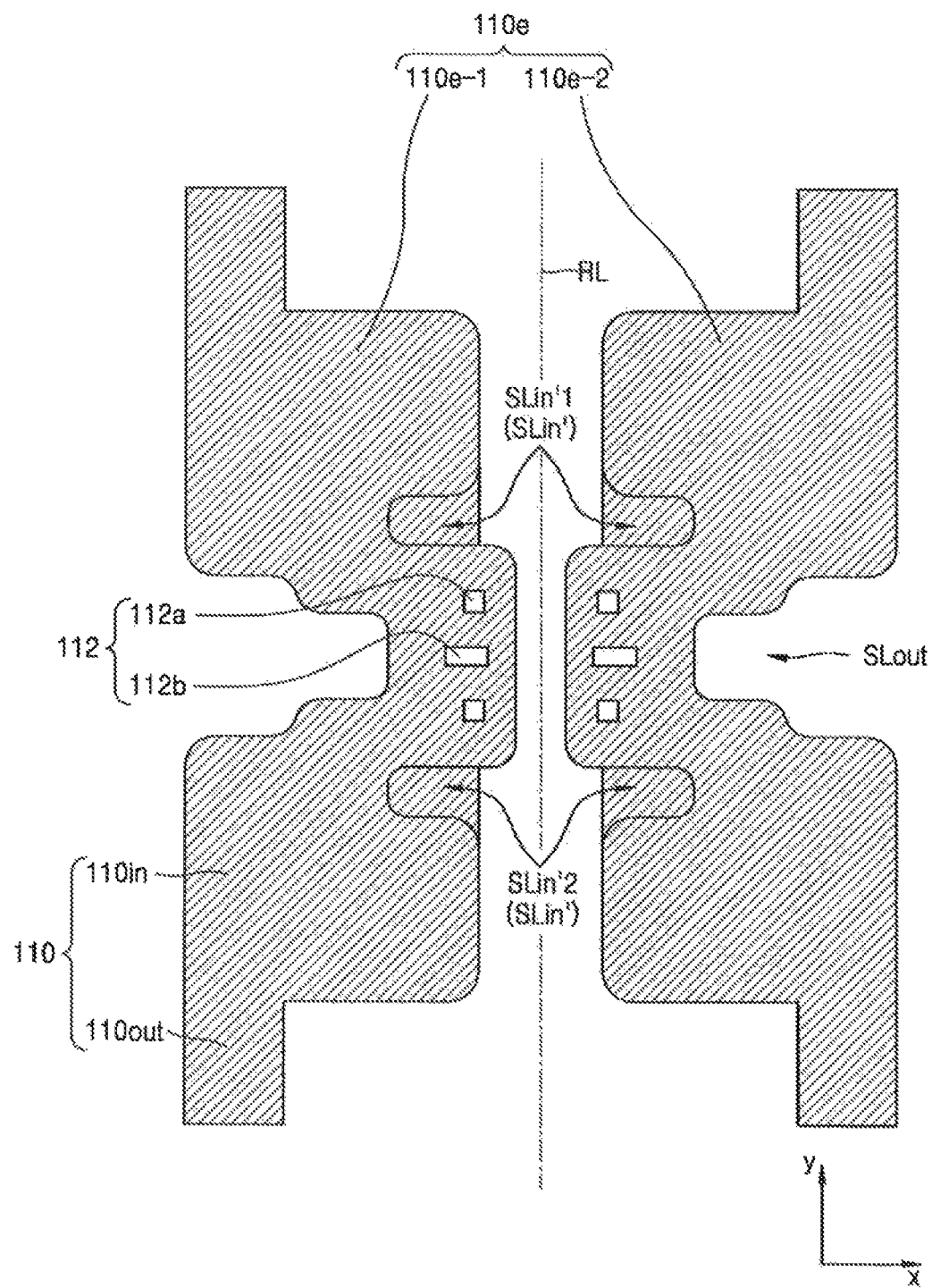

FIGS. 13A and 13B are respectively a cross-sectional view of a light-emitting device package 100*h* and a plan view showing a structure of a lead frame 110*e* included in the light-emitting device package 110*h* according to an embodiment. FIG. 13A is the cross-sectional view corresponding to FIG. 5.

Referring to FIGS. 13A and 13B, the light-emitting device package 100*h* of the present embodiment may be different from the light-emitting device package 100 of FIG. 1. Especially, an inner slot SLin' of the lead frame 110*e* in FIGS. 13A and 13B is different from the inner slot SLin in FIG. 1. Specifically, in the light-emitting device package 100 of FIG. 1, the inner slot SLin of the lead frame 110 may be formed so as to penetrate from a top surface to a bottom surface of the lead frame 110. In contrast, in the light-emitting device package 100*h* of the present embodiment, the inner slot SLin' of the lead frame 110*e* may be formed in a groove structure only in an upper portion of the lead frame 110*e*. Accordingly, as seen from FIGS. 13A and 13B, the lead frame 110*e* may exist at a lower portion of the inner slot SLin'. The lower portion of the inner slot SLin' may have a structure blocked by the lead frame 110*e*.

A structure of the molding structure 120*f* of the light-emitting device package 100*h* of the present embodiment may be different from a structure of the molding, structure 120 of the light-emitting device package 100 of FIG. 1 due to a structural difference of the lead frame 110*e*. For example, in the light-emitting device package 100b of the present embodiment, since the inner slot SLin' of the lead frame 110e has a groove structure, as shown in FIG. 13A, an inner slot molding portion 125in' may be formed as a structure that fills a groove rather than a structure that passes through the lead frame 110e. In other words, the inner slot molding portion 125in' may not be exposed to a lower surface of the lead frame 110e, and accordingly, a thickness of the inner slot molding portion 125in' may be smaller than a thickness of the lead frame 110e.

In addition, a region division of the lead frame 110e by the inner barrier 124 and a structure of the inner barrier 124, the outer slot molding portion 125out, the groove 112 in the first area Ain of the lead frame 110e, and mounting of a flip-chip structure of the light-emitting device chip 130 by using the solder ball 135 positioned in the groove 112 are the same as described with reference to FIGS. 1 to 5.

Furthermore, in the light-emitting device package 100h of the present embodiment, the outer slot SLout of the lead frame 110e may be formed as a through hole, but a structure of the outer slot SLout is not limited thereto. For example, the outer slot SLout may also be formed in a groove structure in which a lower portion thereof is closed. In such a case, the outer slot molding portion 125out may be formed in a structure filling the groove of the outer slot SLout and may not be exposed to the lower surface of the lead frame 110e.

While the inventive concept has been particularly shown and described with reference to embodiments thereof, it will be understood that various changes in form and details may be made therein without departing from the spirit and scope of the following claims.

What is claimed is:

1. A light-emitting device package, comprising:
 a lead frame comprising a first metallic lead and a second metallic lead that are spaced apart from each other in a first direction;
 a light-emitting device chip mounted on a first area of the lead frame, the first area of the lead frame including a part of the first metallic lead and a part of the second metallic lead; and
 a molding structure comprising:
  an outer barrier surrounding at least a part of the lead frame, and
  an electrode separator disposed between the first metallic lead and the second metallic lead and filling space between the first metallic lead and the second metallic lead, the electrode separator extending in a second direction intersecting the first direction,
 wherein each of the first metallic lead and the second metallic lead comprises at least two inner slots formed to extend in the first direction, the at least two inner slots of the first metallic lead penetrating through the first metallic lead from an upper surface to a lower surface of the first metallic lead, the at least two inner slots of the second metallic lead penetrating through the second metallic lead from an upper surface to a lower surface of the second metallic lead, and,
 wherein the molding structure comprises inner slot molding parts integrally connected to the electrode separator and filling the at least two inner slots of each of the first metallic lead and the second metallic lead.

2. The light-emitting device package of claim 1, herein the at least two inner slots of each of the first metallic lead comprise a first inner slot and a second inner slot disposed on both sides of the first area in the second direction.

3. The light-emitting device package of claim 2, wherein the second direction extends perpendicular to the first direction.

4. The light-emitting device package of claim 1, wherein a groove is formed in an upper surface of the first area.

5. The light-emitting device package of claim 1, wherein each of the first metallic lead and the second metallic lead further comprises a slot, the slot of the first metallic lead penetrating through the first metallic lead from an upper surface to a lower surface of the first metallic lead, the slot of the second metallic lead penetrating through the second metallic lead from an upper surface to a lower surface of the second metallic lead, and
 wherein the slot of the first metallic lead and the slot of the second metallic lead are disposed on both sides of the first area in the first direction.

6. The light-emitting device package of claim 1, wherein an inner portion of the electrode separator corresponding to the first area is narrower than an outer portion of the electrode separator.

7. The light-emitting device package of claim 1, wherein the electrode separator has a bottom width at the lower surface larger than a top width at the upper surface.

8. The light-emitting device package of claim 1, wherein the first metallic lead further comprises an outer lead protruding from the molding structure.

9. The light-emitting device package of claim 1, wherein the light-emitting device chip comprises a first electrode and a second electrode provided on a bottom surface thereof, and the light-emitting device chip is mounted on the first area in a flip-structure such that the first electrode and the second electrode are respectively connected to the first metallic lead and the second metallic lead.

10. The light-emitting device package of claim 1, wherein the molding structure, further comprises an inner harrier provided under the light-emitting device, chip.

11. The light-emitting device package of claim 10, wherein the inner barrier overlaps the light-emitting device chip and the inner barrier extends under the light-emitting device chip.

12. The light-emitting device package of claim 11, wherein a fluorescent layer is provided between the light-emitting device chip and the inner barrier.

13. The light-emitting device package of claim 10, wherein the inner barrier overlaps the at least two inner slots of one of the first metallic lead and the second metallic lead.

14. The light-emitting device package of claim 1, wherein a reflective layer comprising reflective metal powder or reflective ceramic power in a resin is formed on an inner wall of the outer barrier.

15. The light-emitting device package of claim 10, wherein the inner barrier divides an area on the lead frame into the first area and a second area, the second area being located outside the first area and inside the outer barrier.

16. A light-emitting device package, comprising:
 a lead frame comprising a first metallic lead and a second metallic lead that are spaced apart from each other in a second direction;
 a light-emitting device chip mounted on a first area of the lead frame, the first area of the lead frame including a part of the first metallic lead and a part of the second metallic lead;
 a molding structure comprising:
  an outer barrier embedding at least a part of the lead frame;
  an inner barrier provided under the light-emitting device chip; and an electrode separator disposed between the first metallic lead and the second metallic lead, the electrode separator extending in a first direction intersecting the second direction, and wherein the first metallic lead comprises a first slot and a second slot, each of which extends from the electrode separator, the first slot being disposed on a first side of the first area, the second slot being disposed on a second side of the first area, opposite to the first side of the first area with respect to the first direction, and each of the first slot and the second slot extends along the first second direction.

17. The light-emitting device package of claim 16, wherein the molding structure expands from the inner barrier to a lower surface of the lead frame through at least one of the first slot and second slot.

18. The light-emitting device package of claim 16, wherein an upper portion of the inner barrier covers the light-emitting device chip and a lower portion of the inner barrier extends under the light-emitting device chip.

19. The light-emitting device package of claim 18, wherein the upper portion of the inner barrier is higher than a bottom surface of the light-emitting device chip.

20. The light-emitting device package of claim 16, wherein the light-emitting device chip comprises a first electrode and a second electrode on a bottom surface thereof, and the light-emitting device chip is mounted on the first area in a flip-structure such that the first electrode and the second electrode are respectively connected to the first metallic lead and the second metallic lead.

* * * * *